(12) United States Patent
Momo et al.

(10) Patent No.: US 11,276,685 B2
(45) Date of Patent: Mar. 15, 2022

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Junpei Momo, Kanagawa (JP); Kazutaka Kuriki, Kanagawa (JP); Hiromichi Godo, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/009,823

(22) Filed: Sep. 2, 2020

(65) Prior Publication Data

US 2020/0402977 A1    Dec. 24, 2020

Related U.S. Application Data

(60) Continuation of application No. 16/238,590, filed on Jan. 3, 2019, now Pat. No. 10,903,206, which is a
(Continued)

(30) Foreign Application Priority Data

Aug. 8, 2014  (JP) .............................. JP2014-162455

(51) Int. Cl.
*H01L 27/00* (2006.01)
*H01L 29/00* (2006.01)
(Continued)

(52) U.S. Cl.
CPC ......... *H01L 27/0629* (2013.01); *H01G 11/14* (2013.01); *H01L 27/1207* (2013.01);
(Continued)

(58) Field of Classification Search
CPC . H01L 21/8258; H01L 21/84; H01L 21/6835; H01L 21/76898; H01L 21/743;
(Continued)

(56) References Cited

U.S. PATENT DOCUMENTS

| 4,725,926 A | 2/1988 | Morimoto et al. |
| 5,055,968 A | 10/1991 | Nishi et al. |

(Continued)

FOREIGN PATENT DOCUMENTS

| EP | 1363319 A | 11/2003 |
| EP | 1632999 A | 3/2006 |

(Continued)

*Primary Examiner* — Nikolay K Yushin
(74) *Attorney, Agent, or Firm* — Nixon Peabody LLP; Jeffrey L. Costellia

(57) ABSTRACT

A semiconductor device in which a circuit and a power storage element are efficiently placed is provided. The semiconductor device includes a first transistor, a second transistor, and an electric double-layer capacitor. The first transistor, the second transistor, and the electric double-layer capacitor are provided over one substrate. A band gap of a semiconductor constituting a channel region of the second transistor is wider than a band gap of a semiconductor constituting a channel region of the first transistor. The electric double-layer capacitor includes a solid electrolyte.

5 Claims, 22 Drawing Sheets

Related U.S. Application Data division of application No. 14/817,242, filed on Aug. 4, 2015, now Pat. No. 10,204,898.

(51) Int. Cl.

| | | |
|---|---|---|
| *H01L 27/06* | (2006.01) | |
| *H01G 11/14* | (2013.01) | |
| *H01L 29/786* | (2006.01) | |
| *H01L 27/12* | (2006.01) | |
| *H01L 29/66* | (2006.01) | |
| *H01G 11/08* | (2013.01) | |
| *H01L 21/8258* | (2006.01) | |

(52) U.S. Cl.
CPC ...... *H01L 27/1211* (2013.01); *H01L 27/1225* (2013.01); *H01L 29/66742* (2013.01); *H01L 29/786* (2013.01); *H01L 29/7869* (2013.01); *H01L 29/78696* (2013.01); *H01G 11/08* (2013.01); *H01L 21/8258* (2013.01); *H01L 27/0688* (2013.01); *Y02E 60/13* (2013.01)

(58) Field of Classification Search
CPC ............ H01L 27/1207; H01L 27/1225; H01L 27/1211; H01L 27/0629; H01L 27/0688; H01L 29/7869; H01L 29/66742; H01L 29/78696; H01L 29/786; H01G 11/14; H01G 11/08; H01G 11/161; H01G 11/165; H01G 11/4023; H01G 11/403
See application file for complete search history.

(56) References Cited

U.S. PATENT DOCUMENTS

| | | | |
|---|---|---|---|
| 7,147,740 B2 | 12/2006 | Takayama et al. | |
| 7,253,494 B2 | 8/2007 | Mino et al. | |
| 8,467,825 B2 | 6/2013 | Kato et al. | |
| 8,517,275 B2 | 8/2013 | Tsuchiya | |
| 8,846,449 B2 | 9/2014 | Morimoto et al. | |
| 8,892,158 B2 | 11/2014 | Kato et al. | |
| 8,945,331 B2 | 2/2015 | Takayama et al. | |
| 9,006,024 B2 | 4/2015 | Akimoto | |
| 9,099,560 B2 | 8/2015 | Yamazaki | |
| 9,293,598 B2 | 3/2016 | Yamazaki et al. | |
| 9,318,374 B2 | 4/2016 | Atsumi et al. | |
| 9,373,643 B2 | 6/2016 | Kato et al. | |
| 9,711,610 B2 | 7/2017 | Yamazaki et al. | |
| 9,741,867 B2 | 8/2017 | Kato et al. | |
| 9,755,084 B2 | 9/2017 | Isobe et al. | |
| 9,965,713 B2 | 5/2018 | Tsuchiya | |
| 10,121,904 B2 | 11/2018 | Kato et al. | |
| 10,170,486 B2 | 1/2019 | Atsumi et al. | |
| 10,290,720 B2 | 5/2019 | Yamazaki et al. | |
| 10,504,920 B2 | 12/2019 | Matsukura | |
| 2007/0228434 A1* | 10/2007 | Shimojo | H01L 27/0203 257/296 |
| 2007/0241199 A1 | 10/2007 | Yamazaki et al. | |
| 2007/0243352 A1 | 10/2007 | Takayama et al. | |
| 2008/0006883 A1 | 1/2008 | Mori | |
| 2008/0156886 A1 | 7/2008 | Tsuchiya | |
| 2008/0158217 A1 | 7/2008 | Hata et al. | |
| 2010/0032661 A1 | 2/2010 | Osterbacka et al. | |
| 2011/0089417 A1 | 4/2011 | Yamazaki et al. | |
| 2011/0101332 A1 | 5/2011 | Yamazaki et al. | |
| 2011/0102018 A1 | 5/2011 | Shionoiri et al. | |
| 2011/0110145 A1 | 5/2011 | Yamazaki et al. | |
| 2013/0161605 A1 | 6/2013 | Sasagawa et al. | |
| 2013/0191673 A1 | 7/2013 | Koyama et al. | |
| 2013/0193433 A1 | 8/2013 | Yamazaki | |
| 2013/0207112 A1 | 8/2013 | Isobe et al. | |
| 2013/0221356 A1 | 8/2013 | Yamazaki et al. | |
| 2014/0183529 A1 | 7/2014 | Yamazaki et al. | |
| 2014/0197802 A1 | 7/2014 | Yamazaki | |
| 2015/0044859 A1 | 2/2015 | Cheng et al. | |
| 2015/0092318 A1 | 4/2015 | Zhaohui | |
| 2015/0108470 A1 | 4/2015 | Yamazaki et al. | |
| 2015/0187823 A1 | 7/2015 | Miyairi et al. | |
| 2015/0222141 A1 | 8/2015 | Yamazaki | |
| 2015/0294991 A1 | 10/2015 | Ishizu | |
| 2015/0299852 A1 | 10/2015 | Ozkan et al. | |
| 2016/0079437 A1 | 3/2016 | Ochi et al. | |
| 2018/0247174 A1 | 8/2018 | Tsuchiya | |

FOREIGN PATENT DOCUMENTS

| | | |
|---|---|---|
| JP | 07-014982 A | 1/1995 |
| JP | 09-129847 A | 5/1997 |
| JP | 2003-133420 A | 5/2003 |
| JP | 2004-320011 A | 11/2004 |
| JP | 2005-026706 A | 1/2005 |
| JP | 2006-032927 A | 2/2006 |
| JP | 2008-181493 A | 8/2008 |
| JP | 2010-517284 | 5/2010 |
| JP | 2011-129891 A | 6/2011 |
| JP | 2013-012730 A | 1/2013 |
| JP | 2013-102133 A | 5/2013 |
| JP | 2013-165132 A | 8/2013 |
| JP | 2013-168644 A | 8/2013 |
| JP | 2013-191769 A | 9/2013 |
| JP | 2013-243349 A | 12/2013 |
| JP | 2013-251536 A | 12/2013 |
| JP | 2013-251884 A | 12/2013 |
| JP | 2014-14341 A | 8/2014 |
| JP | 2014-143410 A | 8/2014 |
| WO | WO-2008/090257 | 7/2008 |
| WO | WO-2011/062042 | 5/2011 |
| WO | WO-2012/157167 | 11/2012 |
| WO | WO-2015/121771 | 8/2015 |

* cited by examiner

230

230

5101  5103  5102  5100

5201
5203
5202
5200

SEMICONDUCTOR DEVICE AND ELECTRONIC DEVICE

BACKGROUND OF THE INVENTION

1. Field of the Invention

One embodiment of the present invention relates to a semiconductor device and an electronic device.

Further, one embodiment of the present invention relates to an object, a method, or a manufacturing method. Further, the present invention relates to a process, a machine, manufacture, or a composition of matter. In addition, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

Electronic devices carried around by the users and electronic devices worn by the users have been actively developed in recent years.

Since electronic devices carried around by the users and electronic devices worn by the users are powered by power storage devices, their power consumption is reduced as much as possible. Particularly in the case where a central processing unit (CPU), which consumes a lot of power for its operation, is included in the electronic device, processing of the CPU greatly affects the power consumption of the electronic device.

A semiconductor device including a high-performance integrated circuit (e.g., a CPU) on a plastic or plastic film substrate, which transmits and receives electric power or signals wirelessly, is described in Patent Document 1.

A semiconductor device in which a register in a CPU is formed using a memory circuit including an oxide semiconductor transistor to reduce power consumption is described in Patent Document 2.

A technique for fabricating an electric double-layer capacitor (EDLC) including a solid electrolyte is proposed in Patent Document 3.

REFERENCE

[Patent Document 1] Japanese Published Patent Application No. 2006-32927
[Patent Document 2] Japanese Published Patent Application No. 2013-251884
[Patent Document 3] Japanese Published Patent Application No. 2013-191769

SUMMARY OF THE INVENTION

The detail of the power consumption of an electronic device including a CPU will be described. The power consumption can be roughly classified into power consumed by a CPU, power consumed by systems around the CPU, and power consumed by a plurality of input/output devices and peripheral devices connected to the inside or outside of the electronic device. The power consumed by systems around the CPU includes a loss in a converter, a loss in a wiring pattern, and power consumed by a bus, a controller, and the like.

When an electronic device is reduced in size or thickness, a power storage element such as a battery or an EDLC is also subjected to the limitation. However, as the power storage element decreases in area, the capacitor thereof also decreases. Thus, a circuit, a power storage element, and the like need to be provided in a smaller space.

Furthermore, a power storage element generates heat by charge and discharge, which may thermally affect the surrounding area.

As an electronic device is reduced in size and a circuit, a power storage element, and the like are stored in a smaller space, control of the power consumption and heat generation becomes a problem.

One embodiment of the present invention provides a novel semiconductor device, a semiconductor device in which a circuit and a power storage element are efficiently stored, a semiconductor device with small power consumption, or a semiconductor device with reduced heat generation.

One embodiment of the present invention provides an electronic device having a novel structure. Specifically, an electronic device having a novel structure that can have various forms is provided. More specifically, a wearable electronic device that is used while being worn on the body and an electronic device that is used while being implanted in the body are provided.

Note that the description of a plurality of objects does not mutually preclude their existence. Note that one embodiment of the present invention does not necessarily achieve all the objects listed above. Objects other than those listed above are apparent from the description of the specification, drawings, and claims, and such objects could be an object of one embodiment of the present invention.

One embodiment of the present invention is a semiconductor device that includes a first transistor, a second transistor, and an electric double-layer capacitor. The first transistor, the second transistor, and the electric double-layer capacitor are preferably provided over one substrate. The first transistor includes a first semiconductor in a channel region. The second transistor includes a second semiconductor in a channel region. A band gap of the second semiconductor is preferably wider than a band gap of the first semiconductor. The electric double-layer capacitor preferably includes a solid electrolyte.

One embodiment of the present invention is a semiconductor device that includes a first transistor, a second transistor, and an electric double-layer capacitor. The first transistor, the second transistor, and the electric double-layer capacitor are preferably provided over one substrate. The first transistor includes a first semiconductor in a channel region. The second transistor includes a second semiconductor in a channel region. A band gap of the second semiconductor is preferably wider than a band gap of the first semiconductor. The electric double-layer capacitor preferably includes an ionic liquid.

In the above embodiments, the first semiconductor preferably includes silicon and the second semiconductor preferably includes an oxide semiconductor.

In the above embodiments, the electric double-layer capacitor is preferably capable of being charged wirelessly.

In the above embodiments, a semiconductor substrate may be used as the substrate.

In the above embodiments, a flexible substrate may be used as the substrate.

One embodiment of the present invention is an electronic device that includes the semiconductor device according to any of the above embodiments and at least one of a microphone, a speaker, a display portion, and an operation key.

Note that the power storage element in this specification and the like refers to all elements that have the function of storing electric power. For example, a lithium-ion secondary battery, a lithium-ion capacitor, and an electric double-layer capacitor are included in the category of the power storage element.

Furthermore, the power storage device in this specification and the like refers to all devices that include the power storage elements.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, the positional relation is not limited to that described with a term used in this specification, and can be explained with another term as appropriate in accordance with the situation.

In this specification and the like, a transistor is an element having at least three terminals of a gate, a drain, and a source. In addition, the transistor has a channel region between a drain (a drain terminal, a drain region, or a drain electrode layer) and a source (a source terminal, a source region, or a source electrode layer), and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that the terms "film" and "layer" can be interchanged with each other in accordance with the case or circumstances. For example, the term "conductive layer" can be changed into the term "conductive film" in some cases. Also, the term "insulating film" can be changed into the term "insulating layer" in some cases.

According to one embodiment of the present invention, it becomes possible to provide a novel semiconductor device, a semiconductor device in which a circuit and a power storage element are efficiently stored, a semiconductor device with small power consumption, or a semiconductor device with reduced heat generation.

Furthermore, according to one embodiment of the present invention, it becomes possible to provide an electronic device having a novel structure. Specifically, it becomes possible to provide an electronic device having a novel structure that can have various forms. More specifically, it becomes possible to provide a wearable electronic device that is used while being worn on the body and an electronic device that is used while being implanted in the body.

Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
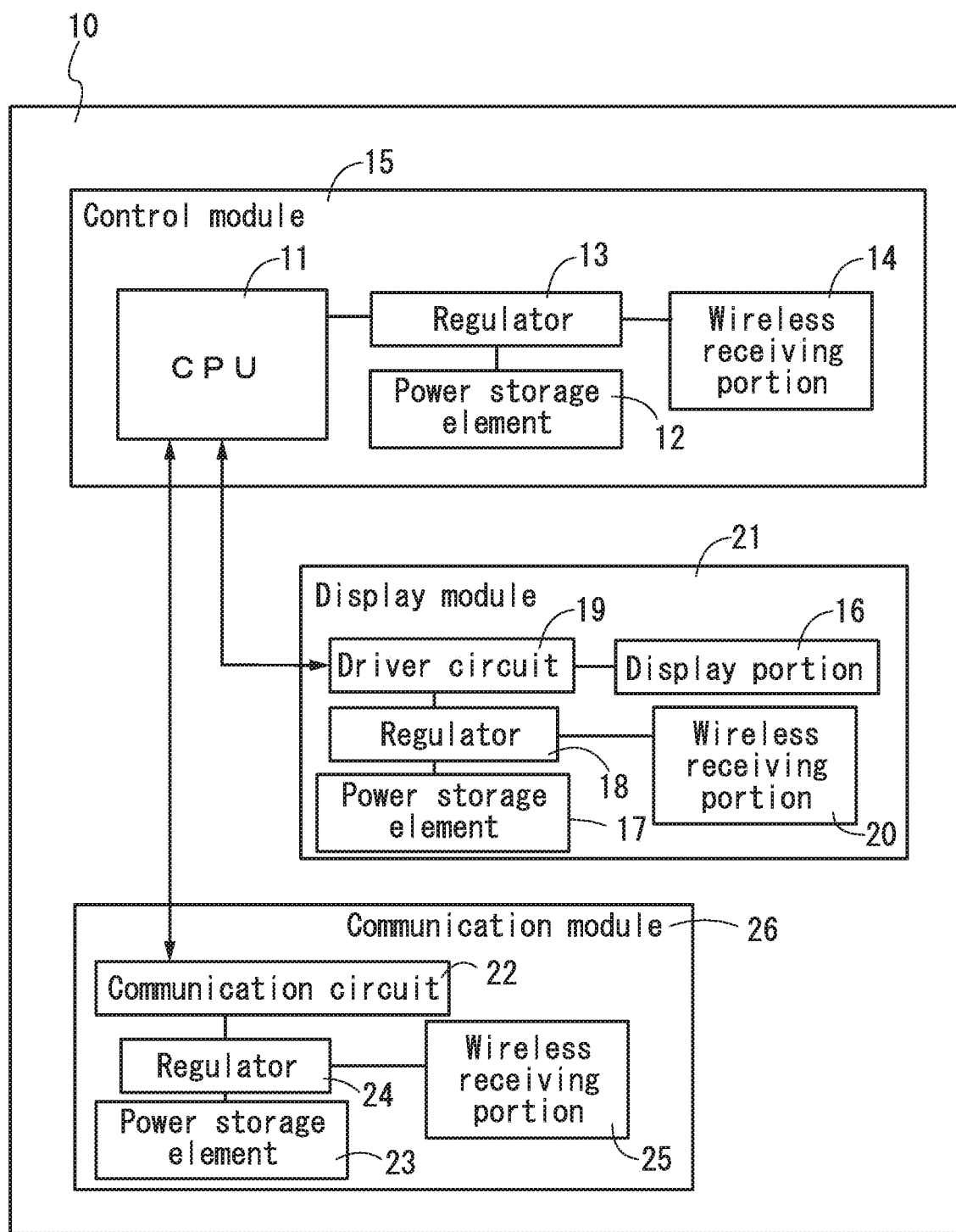
FIG. 1 is a block diagram showing a structural example of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. In addition, in the following embodiments and examples, the same portions or portions having similar functions are denoted by the same reference numerals in different drawings, and description thereof will not be repeated.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to the shapes or values shown in the drawings.

Embodiment 1

<Block Diagram of Device>

FIG. 1 is a block diagram of a device 10 that is one embodiment of the present invention.

The device 10 of this embodiment includes a control module 15, a display module 21, and a communication module 26. The control module 15 is a controller that controls the entire device 10, communication, and display of information on a display portion 16.

The control module 15 includes a CPU 11, a power storage element 12, a regulator 13, and a wireless receiving portion 14.

The display module 21 includes the display portion 16, a display driver circuit 19, a power storage element 17, a regulator 18, and a wireless receiving portion 20.

The communication module 26 includes a communication circuit 22, a power storage element 23, a regulator 24, and a wireless receiving portion 25.

A regulator is an electronic circuit that keeps an output voltage or current constant. A regulator is classified into two kinds, a linear regulator and a switching regulator, that can be used in accordance with the amount of electric load or the like. A switching regulator is also called a DC-DC converter.

Each module includes a regulator and a power storage element. Each power storage element can regain its continuous operating time by means of charging, and is connected to a circuit so that it can be wirelessly charged. The power storage elements are electrically connected to the respective wireless receiving portions via the respective regulators. Each regulator supplies necessary electric power or signals to the functional circuit, from the connected power storage element. In addition, each regulator also has a function of preventing overcharge and the like when the connected power storage element is charged.

It is preferable that the power storage element in each module be provided over the same substrate as the functional circuits included in the same module. In this manner, the device 10 can be reduced in size or thickness.

In the device 10, each of the modules can be turned on or turned off independently. The operating system that selectively drives only the module to be used can reduce power consumption of the device 10.

For example, when the user looks at information on the display portion 16 without using a communication function, the communication circuit 22 is in an off state where the power storage element 23 is not used in order that electric power to the communication circuit 22 is blocked in the communication module 26, while the display module 21 and the control module 15 are in an on state.

Furthermore, for a still image, once the still image is displayed on the display portion 16 with the display module 21 and the control module 15 being in an on state, the still image can be kept displayed while only the display module 21 is in an on state even after the control module 15 is turned off with the still image being displayed. In that case, the control module 15 is not operated although the still image is displayed, and the power consumed by the control module 15 can apparently be zero. Note that when transistors of the display portion 16 include an oxide semiconductor with low off-state current (e.g., an oxide material including in, Ga, and Zn), or when the display portion 16 includes a memory for each of the pixels, the still image can be kept displayed for a certain period even when the supply of electric power from the power storage element 17 is blocked after the still image is displayed.

In this manner, a power storage element is provided for each of the components to be used in the electronic device, and only the component in use is selectively driven, whereby the power consumption can be reduced.

It is preferable that an EDLC be used for the power storage element in each module. An EDLC is capable of being charged and discharged at high speed although it has large capacity. Thus, the device 10 can be driven at high speed.

The electrolyte of the EDLC is preferably solid. A solid electrolyte is safe because it has no risk of spill as compared to a liquid electrolyte and it can be used at a higher temperature than room temperature.

Further, the EDLC preferably includes an ionic liquid that has non-flammability and non-volatility as the electrolyte. The use of an ionic liquid can prevent a power storage element from exploding or catching fire even when the EDLC internally shorts out or the internal temperature increases owing to overcharging or the like.

Note that a memory cell including an oxide semiconductor transistor is preferably used for a register in the CPU 11. With the use of an oxide semiconductor transistor in the CPU 11, even in the case where the operation of the CPU 11 is temporarily stopped and the supply of the power supply voltage is stopped, data can be held and power consumption can be reduced. Specifically, for example, while a user of a personal computer does not input data to an input device such as a keyboard, the operation of the CPU 11 can be stopped, whereby the power consumption can be reduced.

Furthermore, the use of oxide semiconductor transistors as the transistors used for the regulators 13, 18, and 24 can reduce power consumption because of the small off-state current. In particular, a regulator (DC-DC converter) including a control circuit including oxide semiconductor transistors can operate at a temperature of 150° C. or higher. Thus, such a DC-DC converter of an embodiment is preferably used for an electronic device that is likely to operate at high temperatures.

In this embodiment, an example in which the display module 21, the control module 15, and the communication module 26 each have a power storage element is described; however, the total number of power storage elements is not limited to three. The electronic device may additionally include functional modules and their power storage elements, in which case the electronic device has four or more power storage elements in total.

For example, if an exterior body of the device 10 is formed of a flexible material, a wearable device that is used while being worn on the body can be provided. In that case, if small-sized power storage elements are dispersedly arranged in the device 10, a feeling of weight can be reduced as compared to an electronic device having a single large power storage element. In addition, even if the individual small-sized power storage element generates heat, it does not ruin the comfort when wearing the device.

Next, a semiconductor device that can be used for the device 10 will be described with reference to FIGS. 2 to 4.

Structural Example 1 of Semiconductor Device

Figure 2:
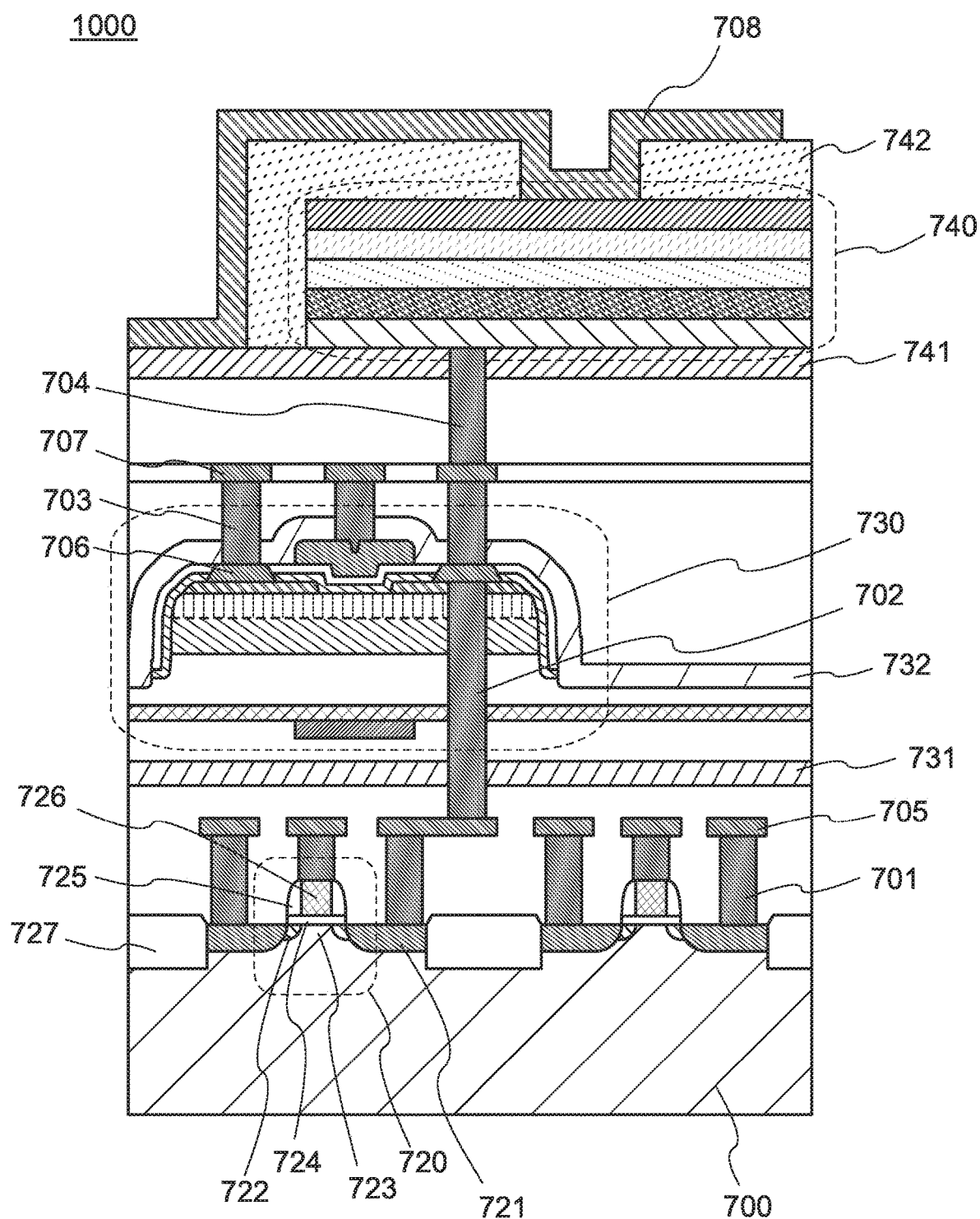
FIG. 2 is a cross-sectional view showing a structural example of a semiconductor device.

FIG. 2 shows a cross-sectional view of a semiconductor device 1000 including a first transistor 720, a second transistor 730, and a power storage element 740 that are formed over the same substrate. The first transistor 720 is provided over a substrate 700, the second transistor 730 is provided over the first transistor 720, and the power storage element 740 is provided over the second transistor 730.

A channel region of the second transistor 730 preferably includes a semiconductor different from that of a channel region of the first transistor 720. Specifically, the second transistor 730 preferably includes a semiconductor with a wider band gap (wide band gap semiconductor) than that of a semicondcutor in the first transistor 720. For example, it is preferable that the semiconductor material in the first transistor 720 be silicon, germanium, silicon germanium, silicon carbide, gallium arsenide, or the like, and that the semiconductor material in the second transistor 730 be an oxide semiconductor. A transistor using single crystal silicon or the like as a semiconductor material can easily operate at high speed. In contrast, a transistor including an oxide semiconductor has a low off-state current.

The power storage element 740 corresponds to the power storage element included in each of the modules of the device 10. A power storage element that can regain its continuous operating time by means of charging is preferably used as the power storage element 740. In particular, an EDLC is preferable. An EDLC is capable of being charged and discharged at high speed although it has large capacity. Thus, the semiconductor device 1000 can be driven at high speed.

The electrolyte of the EDLC is preferably solid. A solid electrolyte is safe because it has no risk of spill as compared to a liquid electrolyte and it can be used at a higher temperature than room temperature.

Further, the EDLC preferably includes an ionic liquid that has non-flammability and non-volatility as the electrolyte. The use of an ionic liquid can prevent a power storage element from exploding or catching fire even when the EDLC internally shorts out or the internal temperature increases owing to overcharging or the like.

The semiconductor device 1000 includes the substrate 700, the first transistor 720, an element isolation layer 727, an insulating film 731, the second transistor 730, an insulating film 732, an insulating film 741, the power storage element 740, an insulating film 742, plugs 701, 702, 703, and 704, and wirings 705, 706, 707, and 708. The first transistor 720 includes a gate electrode 726, a gate insulating film 724, a sidewall insulating layer 725, an impurity region 721 functioning as a source region or a drain region, an impurity region 722 functioning as a lightly doped drain (LDD) region or an extension region, and a channel region 723.

The impurity concentration is higher in the impurity region 721 than in the impurity region 722. The impurity region 721 and the impurity region 722 can be formed in a self-aligned manner, with the gate electrode 726 and the sidewall insulating layer 725 used as a mask.

As the substrate 700, a single crystal semiconductor substrate or a polycrystalline semiconductor substrate of silicon or silicon carbide, a compound semiconductor substrate of silicon germanium, a silicon-on-insulator (SOI) substrate, or the like can be used. A transistor manufactured using a semiconductor substrate can operate at high speed easily. In the case where a p-type single crystal silicon substrate is used as the substrate 700, an impurity element imparting n-type conductivity may be added to part of the substrate 700 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 700 may be a metal substrate or insulating substrate over which a semiconductor film is provided. Examples of the metal substrate are a stainless steel substrate, a substrate including stainless steel foil, a tungsten substrate, and a substrate including tungsten foil. Examples of the insulating substrate are a glass substrate, a quartz substrate, a plastic substrate, a flexible substrate, an attachment film, paper including a fibrous material, and a base film. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, polyvinyl chloride, and the like. Examples of a base film are base films formed using polyester, polyimide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

The first transistor 720 is isolated from other transistors formed on the substrate 700 by an element isolation layer 727.

As the first transistor 720, a transistor containing silicide (salicide) or a transistor which does not include a sidewall insulating layer may be used. When a structure that contains silicide (salicide) is used, resistance of the source region and the drain region can be further lowered and the speed of the semiconductor device can be increased. Further, the semiconductor device can be operated at low voltage; thus, power consumption of the semiconductor device can be reduced.

The second transistor 730 is an oxide semiconductor transistor. The details of the second transistor 730 will be described later in Embodiment 3.

Here, in the case where a silicon-based semiconductor material is used for the first transistor 720 provided in a lower portion, hydrogen in an insulating film provided in the vicinity of the semiconductor film of the first transistor 720 terminates dangling bonds of silicon; accordingly, the reliability of the first transistor 720 can be improved. Meanwhile, in the case where an oxide semiconductor is used for the second transistor 730 provided in an upper portion, hydrogen in an insulating film provided in the vicinity of the semiconductor film of the second transistor 730 becomes a factor of generating carriers in the oxide semiconductor; thus, the reliability of the second transistor 730 might be decreased. Therefore, in the case where the second transistor 730 using an oxide semiconductor is provided over the first transistor 720 using a silicon-based semiconductor material, it is particularly effective that the insulating film 731 having a function of preventing diffusion of hydrogen is provided between the first transistor 720 and the second transistor 730. The insulating film 731 makes hydrogen remain in the lower portion, thereby improving the reliability of the first transistor 720. In addition, since the insulating film 731 suppresses diffusion of hydrogen from the lower portion to the upper portion, the reliability of the second transistor 730 can also be improved.

The insulating film 731 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, the insulating film 732 having a function of preventing diffusion of hydrogen is preferably formed over the second transistor 730 to cover the second transistor 730 including an oxide semiconductor film. For the insulating film 732, a material that is similar to that of the insulating film 731 can be used, and in particular, an aluminum oxide film is preferably used. An aluminum oxide film has a high shielding (blocking) effect of preventing penetration of both oxygen and impurities such as hydrogen and moisture. Thus, by using an aluminum oxide film as the insulating film 732 covering the second transistor 730, release of oxygen from the oxide semiconductor film included in the second transistor 730 can be prevented and entry of water and hydrogen into the oxide semiconductor film can be prevented.

The plugs 701 to 704 and the wirings 705 to 707 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material that has both heat resistance and conductivity, such as tungsten or molybdenum. In addition, the plugs and wirings are preferably formed using a low-resistance conductive material such as aluminum or copper. Further, the plugs and wirings are preferably formed using a Cu—Mn alloy, since in that case, manganese oxide formed at the interface with an insulator containing oxygen has a function of preventing Cu diffusion.

The power storage element 740 is an electric double-layer capacitor that can regain its continuous operating time by means of charging, and an all-solid-state battery including a solid electrolyte. Furthermore, in order to enable wireless charging, the power storage element 740 is electrically connected to a wireless receiving portion via a regulator.

The power storage element 740 may be fabricated through a semiconductor manufacturing process. Note that the semiconductor manufacturing process refers to methods in general that are used for manufacturing semiconductor devices, such as a film formation process, a crystallization process, a plating process, a cleaning process, a lithography process, an etching process, a polishing process, an impurity implantation process, or a heat treatment process.

The details of the power storage element 740 will be described later in Embodiment 2.

The insulating film 741 can be formed to have a single-layer structure or a stacked-layer structure using one or more of silicon oxide, silicon oxynitride, silicon nitride oxide, silicon nitride, aluminum oxide, aluminum nitride, aluminum oxynitride, hafnium oxide, zirconium oxide, yttrium oxide, gallium oxide, lanthanum oxide, cesium oxide, tantalum oxide, and magnesium oxide.

In the case where the power storage element 740 includes lithium, the insulating film 741 preferably has a function of preventing (blocking) diffusion of lithium. When lithium that is included in the power storage element 740 enters a semiconductor element (the first transistor 720 or the second transistor 730) as a movable ion, the semiconductor element deteriorates. With the insulating film 741 blocking lithium ions, a highly reliable semiconductor device can be provided.

In the case where the power storage element 740 includes lithium, the insulating film 741 preferably includes halogen such as fluorine, chlorine, bromine, or iodine. When the insulating film 741 includes halogen, the halogen is easily combined with lithium that is an alkali metal. Then, lithium is fixed in the insulating film 741, whereby diffusion of lithium to the outside of the insulating film 741 can be prevented.

In the case where the insulating film 741 is formed of silicon nitride by a chemical vapor deposition (CVD) method, for example, when a halogen-containing gas is mixed in a source gas at 3% to 6% (volume ratio), e.g., at 5%, the obtained silicon nitride film includes the halogen. The concentration of the halogen element included in the insulating film 741, measured by secondary ion mass spectrometry (SIMS), is greater than or equal to $1\times10^{17}$ atoms/cm$^3$, preferably greater than or equal to $1\times10^{18}$ atoms/cm$^3$, and more preferably greater than or equal to $1\times10^{19}$ atoms/cm$^3$.

The insulating film 742 has a function of protecting the power storage element 740. As the insulating film 742, for example, an insulating material such as a resin (e.g., a polyimide resin, a polyamide resin, an acrylic resin, a siloxane resin, an epoxy resin, or a phenol resin), glass, an amorphous compound, or ceramics can be used. Furthermore, a layer containing calcium fluoride or the like may be provided as a water absorption layer between resin layers. The insulating film 742 can be formed by a spin coating method, an ink-jet method, or the like. Alternatively, the insulating film 742 can be formed to have a single-layer structure or a stacked-layer structure using one or more of silicon oxide, silicon oxynitride, silicon nitride oxide, silicon nitride, aluminum oxide, aluminum nitride, aluminum oxynitride, hafnium oxide, zirconium oxide, yttrium oxide, gallium oxide, lanthanum oxide, lanthanum oxide, cesium oxide, tantalum oxide, and magnesium oxide.

The semiconductor device 1000 may further include a semiconductor element over the power storage element 740. In that case, the insulating film 742 preferably has a function of preventing (blocking) diffusion of lithium, as with the insulating film 741. With the insulating film 742 blocking lithium, a highly reliable semiconductor device can be provided.

In the case where a semiconductor element is formed over the power storage element 740, the insulating film 742 preferably includes halogen such as fluorine, chlorine, bromine, or iodine, as with the insulating film 741. With the insulating film 742 including halogen, the halogen is easily combined with lithium that is an alkali metal, whereby diffusion of lithium to the outside of the insulating film 742 can be prevented.

Figure 3:
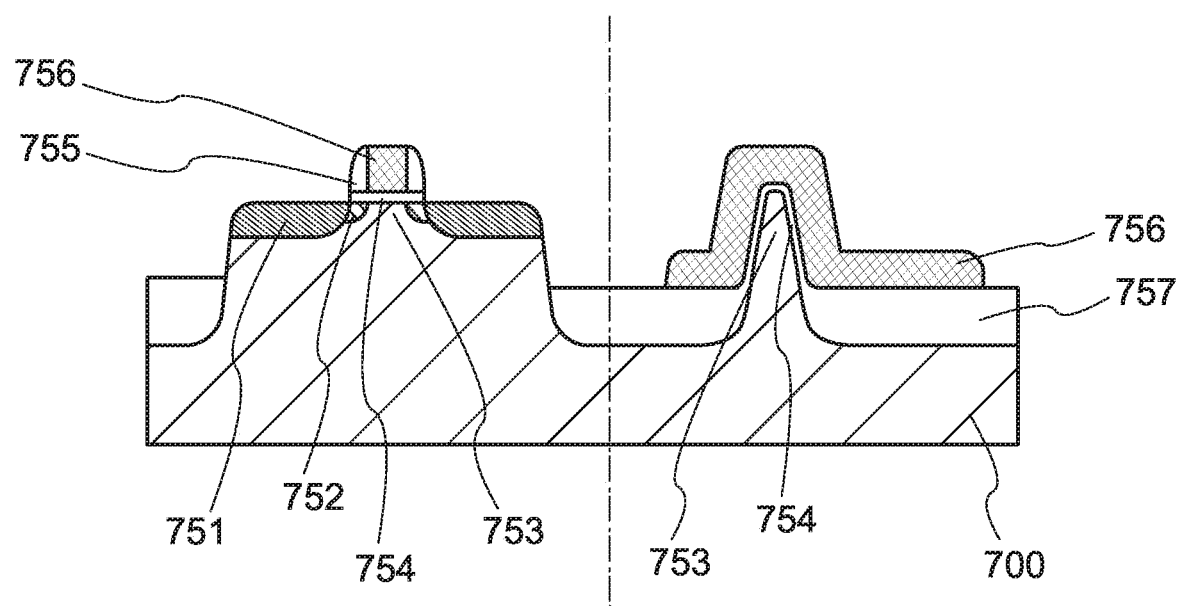
FIG. 3 is a cross-sectional view of a transistor.
Figure 4:
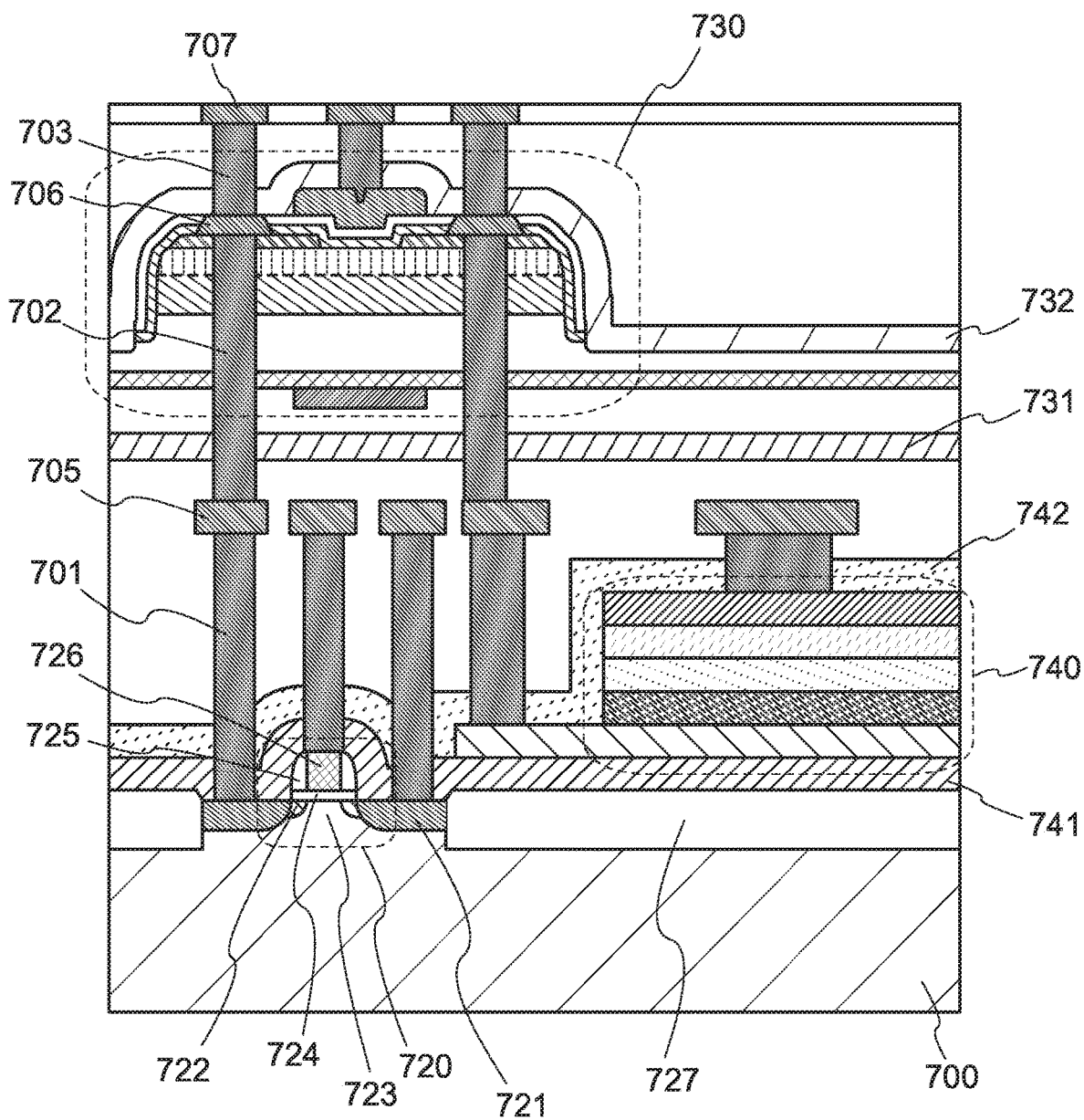
FIG. 4 is a cross-sectional view showing a structural example of a semiconductor device.

In FIGS. 2 to 4, regions where reference numerals and hatching patterns are not given show regions formed of an insulator. The region can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, in these regions, an organic resin such as a polyimide resin, a polyamide resin, an acrylic resin, a siloxane resin, an epoxy resin, or a phenol resin can be used.

The semiconductor device 1000 in FIG. 2 preferably includes a cooling device such as a heat sink, a water-cooling cooler, or a cooling fan over the power storage element 740. The provision of the cooling device can prevent a malfunction of the semiconductor device 1000 caused by heat generation of the power storage element 740.

The semiconductor device 1000 in FIG. 2 may include an air gap (a space of a vacuum layer) between the power storage element 740 and the first and second transistors 720 and 730. The provision of the air gap can prevent heat generated in the power storage element 740 from being conducted to the first transistor 720 and the second transistor 730. Thus, malfunctions of the first transistor 720 and the second transistor 730 caused by heat can be prevented.

Although the power storage element 740 is provided over the first transistor 720 and the second transistor 730 in FIG. 2, the power storage element 740 may be provided between the first transistor 720 and the second transistor 730. In that case, the first transistor 720, the power storage element 740, and the second transistor 730 are formed in this order. In the case where formation of the power storage element 740 requires heat treatment at such a high temperature as will destroy the second transistor 730 in particular, it is preferable to form the second transistor 730 after forming the power storage element 740.

The circuits of the CPU 11 or the regulator 13 and the like included in the device 10 in FIG. 1 are fabricated using the first transistor 720 and the second transistor 730, and the power storage element 740 is fabricated over the same substrate as that of the circuits, for example, whereby the device 10 can be reduced in size or thickness.

Structural Example 2 of Semiconductor Device

Although the first transistor 720 in FIG. 2 is a planar transistor, the form of the first transistor 720 is not limited thereto. For example, a FIN-type or TRI-GATE transistor 750 shown in FIG. 3 may be used as the first transistor 720.

FIG. 3 shows cross-sectional views of the transistor 750. The left cross-sectional view shows a cross section of the transistor 750 in the channel length direction, and the right cross-sectional view shows that in the channel width direction.

In FIG. 3, an insulating film 757 is provided over the substrate 700. The substrate 700 includes a protruding portion with a thin tip (also referred to as a fin). Note that an insulating film may be provided over the protruding portion. The insulating film functions as a mask for preventing the substrate 700 from being etched when the projecting portion is formed. Alternatively, the protruding portion may not have the thin tip; a protruding portion with a cuboid-like protruding portion and a protruding portion with a thick tip are permitted, for example. A gate insulating film 754 is provided over the protruding portion of the substrate 700, and a gate electrode 756 and a sidewall insulating layer 755 are formed thereover. In the substrate 700, an impurity region 751 functioning as a source region or a drain region, an impurity region 752 functioning as an LDD region or an extension region, and a channel region 753 are formed. Note that here is shown an example in which the substrate 700 includes the protruding portion; however, a semiconductor device of one embodiment of the present invention is not limited thereto. For example, a semiconductor region having a protruding portion may be formed by processing an SOI substrate.

Structure Example 3 of Semiconductor Device

A semiconductor device 1200 in FIG. 4 is different from the semiconductor device 1000 in FIG. 2 in that the first transistor 720 and the power storage element 740 are provided below the second transistor 730, and that the first transistor 720 and the power storage element 740 do not overlap with each other.

For the semiconductor device 1200 having the structure shown in FIG. 4, plugs and wirings connected to the first transistor 720 can be formed at the same time as plugs and wirings connected to the power storage element 740, whereby the process can be simplified. Furthermore, in the case where formation of the power storage element 740 requires heat treatment at such a high temperature as will destroy the plug 701 or the wiring 705, the structure shown in FIG. 4 is preferable because the plug 701 and the wiring 705 can be formed after the power storage element 740 is formed.

In FIG. 4, the power storage element 740 is formed after the first transistor 720 is formed; however, the first transistor 720 may be formed after the power storage element 740 is formed first. In the case where formation of the power storage element 740 requires heat treatment at such a high temperature as will destroy the first transistor 720 in particular, it is preferable to form the power storage element 740 first and then form the first transistor 720.

For the other components of the semiconductor device 1200, the description of the semiconductor device 1000 is referred to.

The structure and method described in this embodiment can be implemented by being combined as appropriate with any of the other structures and methods described in the other embodiments.

Embodiment 2

In this embodiment, the detail and structural examples of an electric double-layer capacitor (EDLC) that can be used for the power storage element mentioned in Embodiment 1 will be described with reference to drawings.

Structural Example 1 of Power Storage Element

Figure 5A:
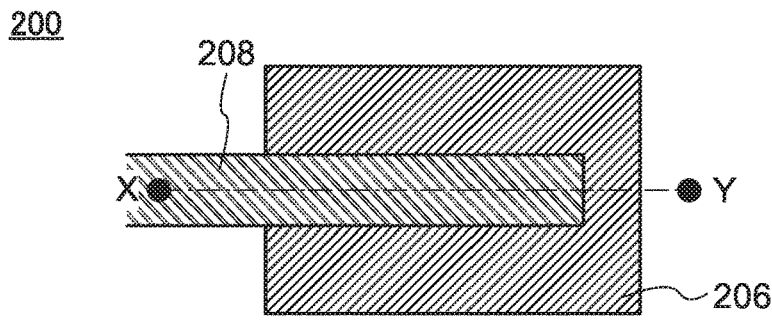
FIG. 5A is a top view and FIGS. 5B and 5C are cross-sectional views showing structural examples of an electric double-layer capacitor.
Figure 5B:
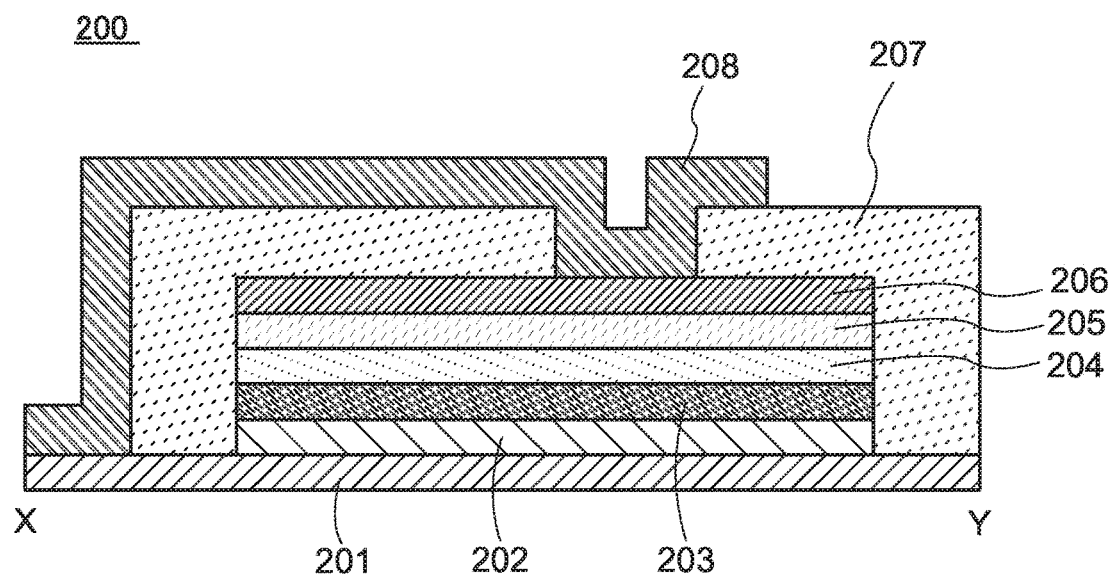

FIG. 5A is a top view of an EDLC 200, and FIG. 5B shows a cross-sectional view taken along the dashed-dotted line X-Y in FIG. 5A. In FIG. 5A, some components are increased or reduced in size, or omitted for easy understanding.

The EDLC 200 in FIGS. 5A and 5B includes an insulating film 201, a current collector layer 202 formed over the insulating film 201, an active material layer 203 formed over the current collector layer 202, an electrolyte layer 204 formed over the active material layer 203, an active material layer 205 formed over the electrolyte layer 204, and a current collector layer 206 formed over the active material layer 205. The current collector layer 202 and the active material layer 203 have a function of one of a positive electrode and a negative electrode, and the active material layer 205 and the current collector layer 206 have a function of the other of the positive electrode and the negative electrode. In addition, an insulating film 207 is formed at least over the current collector layer 206, and a wiring 208 is formed in an opening portion of the insulating film 207. The wiring 208 is electrically connected to the current collector layer 206.

The insulating film 201 may be formed as a single layer or a stacked layer using at least one of the following materials: silicon oxide, silicon oxynitride, silicon nitride oxide, silicon nitride, aluminum oxide, aluminum nitride, aluminum oxynitride, hafnium oxide, zirconium oxide, yttrium oxide, gallium oxide, lanthanum oxide, cesium oxide, tantalum oxide, and magnesium oxide.

The current collector layer 202 and the current collector layer 206 can be formed by a sputtering method, a CVD method, a nanoimprint method, an evaporation method, a coating method, or the like. When a sputtering method is used, it is preferable to use a DC power supply rather than an RF power supply for deposition. A sputtering method using a DC power supply is preferable because the deposition rate is high and thus cycle time is short. The thickness of each of the current collector layers 202 and 206 may be greater than or equal to 100 nm and less than or equal to 100 μm, for example.

For the current collector layers 202 and 206, a conductive material or the like can be used, for example. The current collector layers 202 and 206 may be each a single layer or a stacked layer formed using, for example, one or more of the following as the conductive material: gold, platinum, zinc, iron, nickel, copper, aluminum, titanium, tantalum, and manganese. Alternatively, a single-layer or stacked-layer conductive film including an alloy of the above metals or a compound containing any of these as a main component may be used. Alternatively, the current collector layers 202 and 206 can be formed using an aluminum alloy to which an element that improves heat resistance, such as silicon, neodymium, scandium, or molybdenum, is added. Still alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like.

For the active material layers 203 and 205, a material with a high specific surface area, onto and from which ions can be adsorbed and desorbed, may be used. For example, a carbon-based material can be used. Examples of a carbon-based material include activated carbon, graphite, graphitizing carbon (soft carbon), non-graphitizing carbon (hard carbon), a carbon nanotube, graphene, and carbon black. Examples of graphite include artificial graphite such as meso-carbon microbeads (MCMB), coke-based artificial graphite, or pitch-based artificial graphite and natural graphite such as spherical natural graphite.

Furthermore, it is possible to use the above material, onto and from which ions can be adsorbed and desorbed, for one of the active material layers 203 and 205 and use a material, into and from which ions can be inserted and extracted, for the other of the active material layers 203 and 205. As examples of a material into and from which ions can be inserted and extracted, the above carbon-based materials can be given.

It is also possible to use the above material, onto and from which ions can be adsorbed and desorbed, for one of the active material layers 203 and 205 and use a material, which can be alloyed and dealloyed with lithium ions, for the other of the active material layers 203 and 205. As a metal that can be alloyed and dealloyed with lithium ions, a material containing at least one of Ga, Si, Al, Ge, Sn, Pb, Sb, Bi, Ag, Zn, Cd, In, and the like can be used, for example. Examples of the alloy-based material using such elements include $Mg_2Si$, $Mg_2Ge$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_2$, $CoSb_3$, InSb, and SbSn. Further, an oxide such as SiO, SnO, or $SnO_2$ may also be used for the other of the active material layers 203 and 205.

Further, the active material layers 203 and 205 may each include a binder for increasing adhesion of the active material.

It is preferable for the binder to include, for example, water-soluble polymers. As the water-soluble polymers, a polysaccharide or the like can be used. As the polysaccharide, a cellulose derivative such as carboxymethyl cellulose (CMC), methyl cellulose, ethyl cellulose, hydroxypropyl cellulose, diacetyl cellulose, or regenerated cellulose, starch, or the like can be used.

As the binder, a rubber material such as styrene-butadiene rubber (SBR), styrene-isoprene-styrene rubber, acrylonitrile-butadiene rubber, butadiene rubber, or ethylene-propylene-diene copolymer is preferably used. Any of these rubber materials is more preferably used in combination with the aforementioned water-soluble polymers.

Alternatively, as the binder, a material such as polystyrene, poly(methyl acrylate), poly(methyl methacrylate) (PMMA), sodium polyacrylate, polyvinyl alcohol (PVA), polyethylene oxide (PEO), polypropylene oxide, polyimide, polyvinyl chloride, polytetrafluoroethylene, polyethylene, polypropylene, isobutylene, polyethylene terephthalate, nylon, polyvinylidene fluoride (PVdF), or polyacrylonitrile (PAN) can be preferably used.

Two or more of the above materials may be used in combination for the binder.

Furthermore, the active material layers 203 and 205 may each include a conductive additive or the like for improving the conductivity of the active material layers.

Examples of the conductive additive include natural graphite, artificial graphite such as mesocarbon microbeads, and carbon fiber. Examples of carbon fiber include mesophase pitch-based carbon fiber, isotropic pitch-based carbon fiber, carbon nanofiber, and carbon nanotube. Carbon nanotube can be formed by, for example, a vapor deposition method. Other examples of the conductive additive include carbon materials such as carbon black (acetylene black (AB)) and graphene. Alternatively, metal powder or metal fibers of copper, nickel, aluminum, silver, gold, or the like, a conductive ceramic material, or the like can be used.

Flaky graphene has an excellent electrical characteristic of high conductivity and excellent physical properties of high flexibility and high mechanical strength. Thus, the use of graphene as the conductive additive can increase contact points and the contact area of active materials.

Note that graphene in this specification includes single-layer graphene and multi layer graphene including two to hundred layers. Single-layer graphene refers to a one-atom-thick sheet of carbon molecules having π bonds. Graphene oxide refers to a compound formed by oxidation of such graphene. When graphene oxide is reduced to form graphene, oxygen contained in the graphene oxide is not entirely released and part of the oxygen remains in the graphene. In the case where graphene contains oxygen, the proportion of the oxygen measured by X-ray photoelectron spectroscopy (XPS) is greater than or equal to 2% and less than or equal to 20%, preferably greater than or equal to 3% and less than or equal to 15% of the whole graphene.

The film thickness of each of the active material layers 203 and 205 may be greater than or equal to 100 nm and less than or equal to 100 μm, for example.

The electrolyte layer 204 preferably includes a solid electrolyte that can be formed by a sputtering method, an evaporation method, a CVD method, a laser ablation method, a gas deposition method, a coating method, a sol-gel method, or the like.

A sulfide-based solid electrolyte can be used for the electrolyte layer 204. Examples of a sulfide-based solid electrolyte are lithium complex sulfide materials such as $Li_7P_3S_{11}$, $Li_{3.25}P_{0.95}S_4$, $Li_{10}GeP_2S_{12}$, $Li_{3.25}Ge_{0.25}P_{0.75}S_4$, $Li_2S—P_2S_5$, $Li_2S—GeS_2$, $Li_2S—SiS_2—Li_3PO_4$, $Li_2S—SiS_2—Ga_2S_3$, $Li_2S—SiS_2—Li_4SiO_4$, $LiI—Li_2S—P_2S_5$, $LiI—Li_2S—B_2S_3$, and $LiI—Li_2S—SiS_2$.

An oxide-based solid electrolyte can also be used as the electrolyte layer 204. Examples of an oxide-based solid electrolyte include $Li_{1.3}Al_{0.3}Ti_{1.7}(PO_4)_3$, $Li_{1.07}Al_{0.69}Ti_{1.46}(PO_4)_3$, $Li_4SiO_4—Li_3BO_3$, $Li_{2.9}PO_{3.3}N_{0.46}$, $Li_{3.6}Si_{0.6}P_{0.4}O_4$, $Li_{1.5}Al_{0.5}Ge_{1.6}(PO_4)_3$, $Li_2O$, $Li_2CO_3$, $Li_2MoO_4$, $Li_3PO_4$, $Li_3VO_4$, $Li_4SiO_4$, $LLT(La_{2/3-x}Li_{3x}TiO_3)$, and $LLZ(Li_7La_3Zr_2O_{12})$.

A solid electrolyte containing $Li^+$ and $BH_4^-$ may also be used for the electrolyte layer 204. For example, solid electrolytes such as $LiBH_4$, $Li(BH_4)_{0.75}I_{0.25}$, and $Li(BH_4)_{0.75}Br_{0.25}$ may be used.

Alternatively, a polymer solid electrolyte such as polyethylene oxide) (PEO) formed by a coating method or the like may be used for the electrolyte layer 204. Still alternatively, a composite solid electrolyte containing any of the above inorganic solid electrolytes and a polymer solid electrolyte may be used.

The thickness of the electrolyte layer 204 may be, for example, greater than or equal to 100 nm and less than or equal to 100 μm.

The insulating film 207 has a function of protecting the EDLC 200. As the insulating film 207, for example, an insulating material such as a resin (e.g., a polyimide resin, a polyamide resin, an acrylic resin, a siloxane resin, an epoxy resin, or a phenol resin), glass, an amorphous compound, or ceramics can be used. Furthermore, a layer containing calcium fluoride or the like may be provided as a water absorption layer between resin layers. The insulating film 207 can be formed by a spin coating method, an ink-jet method, or the like. Alternatively, the insulating film 207 can be formed to have a single-layer structure or a stacked-layer structure using one or more of silicon oxide, silicon oxynitride, silicon nitride oxide, silicon nitride, aluminum oxide, aluminum nitride, aluminum oxynitride, hafnium oxide, zirconium oxide, yttrium oxide, gallium oxide, lanthanum oxide, cesium oxide, tantalum oxide, and magnesium oxide.

The wiring 208 preferably has a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni) chromium (Cr), lead (Pb), tin (Sn), iron (Fe), and cobalt (Co), an alloy of such a low-resistance material, or a compound containing such a material as its main component.

Figure 5C:
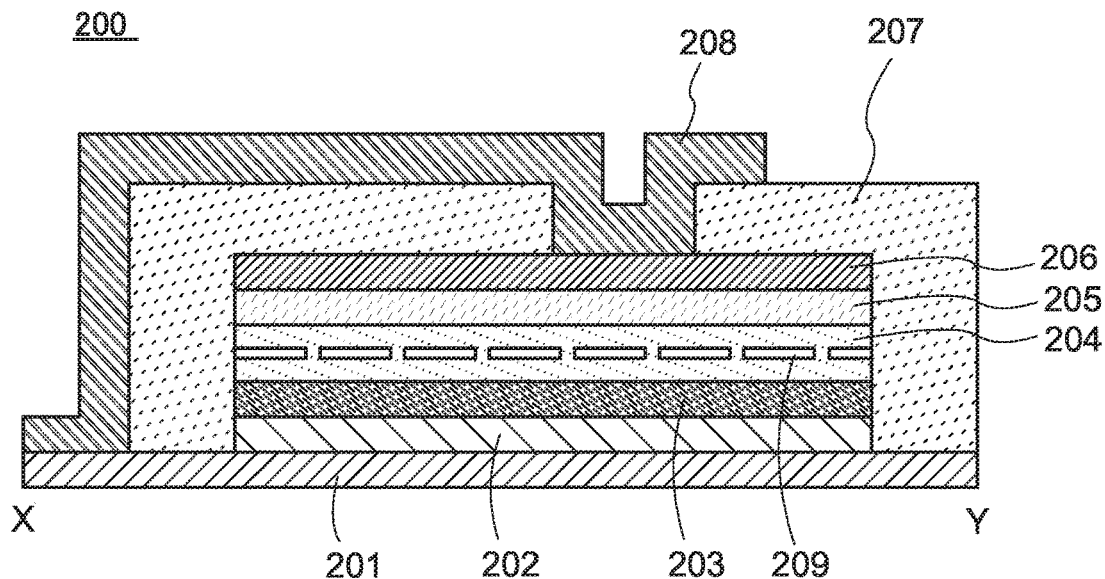

A separator 209 may be provided in the electrolyte layer 204 to prevent the positive electrode and the negative electrode from being short-circuited, as shown in FIG. 5C. As the separator 209, an insulator with pores is preferably used. For example, cellulose, polypropylene, polyethylene, and the like may be used.

Furthermore, in accordance with the amount of electric power required for a semiconductor device or electronic device connected to the EDLC, a plurality of EDLCs 200 may be connected in series and/or in parallel. In particular, connecting a plurality of stacked EDLCs 200 in series and/or in parallel is preferable because the energy density of the EDLC can be increased while the area occupied by the EDCL can be reduced.

Fabricating the EDLC 200 with the above-described structures leads to a safer, more reliable power storage element. In addition, a minute power storage element having a high affinity for a semiconductor element can be provided.

Structural Example 2 of Power Storage Element

Figure 6A:
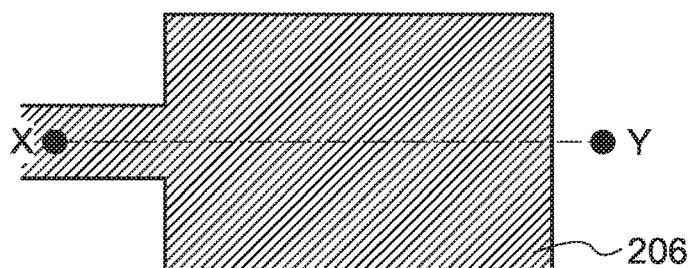
FIG. 6A is a top view and FIGS. 6B and 6C are cross-sectional views showing structural examples of an electric double-layer capacitor.
Figure 6B:
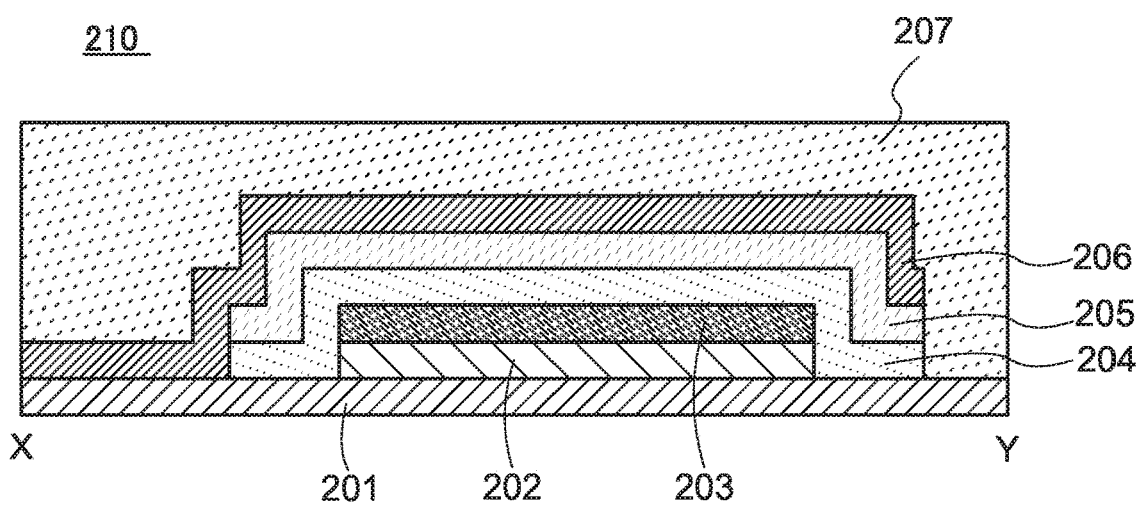

FIG. 6A is a top view of an EDLC 210, and FIG. 6B shows a cross-sectional view taken along the dashed-dotted line X-Y in FIG. 6A. In FIG. 6A, some components are increased or reduced in size, or omitted for easy understanding.

The EDLC 210 in FIGS. 6A and 6B is different from the EDLC 200 in FIGS. 5A and 5B in that an electrolyte layer 204, an active material layer 205, and a current collector layer 206 are formed after an electrolyte layer 202 and an active material layer 203 are processed to take island shapes. Such a structure can prevent a positive electrode and a negative electrode from being short-circuited. In addition, the EDLC 210 is different from the EDLC 200 in that the current collector layer 206 is used as a lead wiring.

Figure 6C:
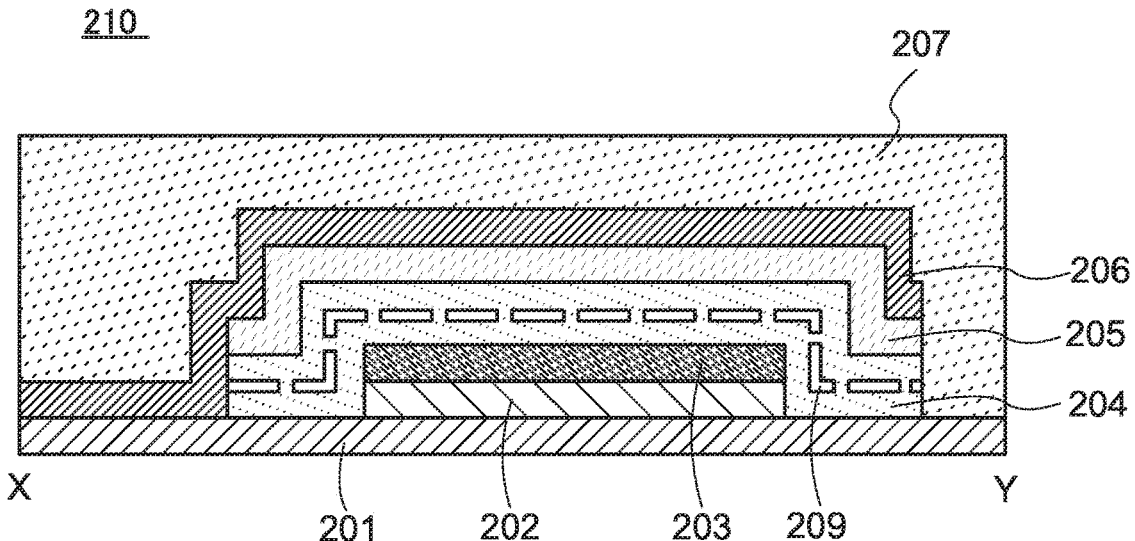

A separator 209 may be provided in the electrolyte layer 204 to prevent the positive electrode and the negative electrode from being short-circuited, as shown in FIG. 6C. As the separator 209, an insulator with pores is preferably used. For example, cellulose, polypropylene, polyethylene, and the like may be used.

For the details of the other components, the description regarding the EDLC 200 in FIGS. 5A to 5C is referred to.

Fabricating the EDLC 210 with the above-described structures leads to a safer, more reliable power storage element. In addition, a minute power storage element having a high affinity for a semiconductor element can be provided.

Structural Example 3 of Power Storage Element

Figure 7A:
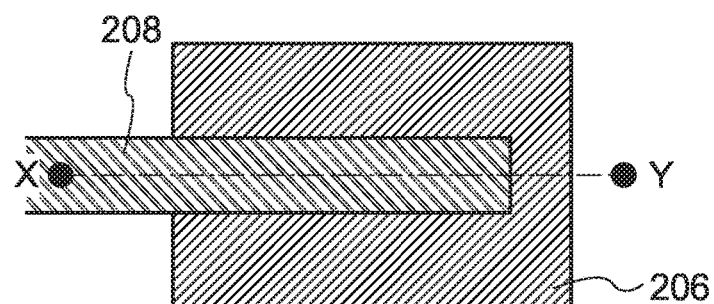
FIG. 7A is a top view and FIG. 7B is a cross-sectional view showing a structural example of an electric double-layer capacitor.
Figure 7B:
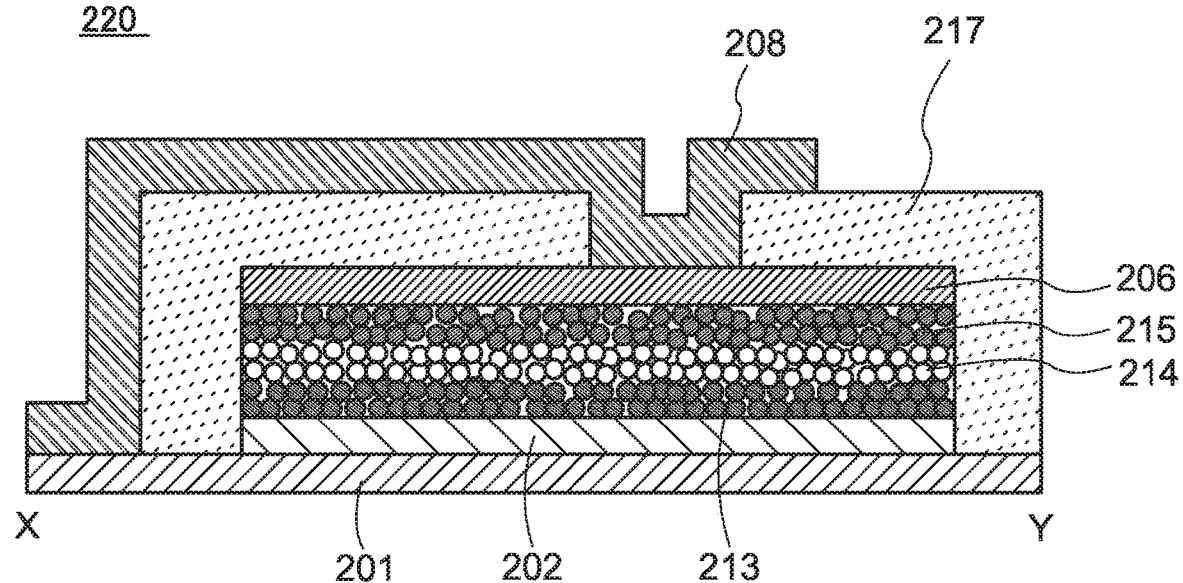

FIG. 7A is a top view of an EDLC 220, and FIG. 7B shows a cross-sectional view taken along the dashed-dotted line X-Y in FIG. 7A. In FIG. 7A, some components are increased or reduced in size, or omitted for easy understanding.

The EDLC 220 in FIGS. 7A and 7B includes an insulating film 201, a current collector layer 202 formed over the insulating film 201, an active material layer 213 formed over the current collector layer 202, a separator 214 formed over the active material layer 213, an active material layer 215 formed over the separator 214, and a current collector layer 206 formed over the active material layer 215. The current collector layer 202 and the active material layer 213 have a function of one of a positive electrode and a negative electrode, and the active material layer 215 and the current collector layer 206 have a function of the other of the positive electrode and the negative electrode. In addition, an insulating film 217 is formed at least over the current collector layer 206, and a wiring 208 is formed in an opening portion of the insulating film 217. The wiring 208 is electrically connected to the current collector layer 206.

It is preferable that each of the active material layer 213, the separator 214, and the active material layer 215 be made up of a particulate substance and include an ionic liquid.

Note that in FIG. 7B, the active material layer 213, the separator 214, and the active material layer 215 are shown with collections of circles in order to schematically show that each layer is made up of a particulate substance. The numbers, sizes, and shapes of the circles in the figure do not reflect the numbers, sizes, and shapes of the actual particles.

Next, the fabrication method of the EDLC 220 will be described with reference to FIGS. 8A to 8D.

Figure 8A:
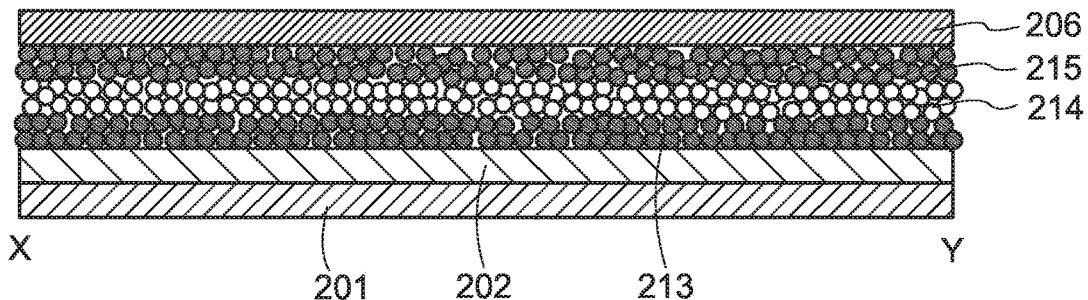
FIGS. 8A to 8D are cross-sectional views illustrating a manufacturing method of an electric double-layer capacitor.

First, the current collector layer 202, the active material layer 213, the separator 214, the active material layer 215, and the current collector layer 206 are formed or deposited over the insulating film 201 (FIG. 8A).

The insulating film 201 and the current collector layers 202 and 206 can be formed by a sputtering method, a CVD method, a nanoimprint method, an evaporation method, a coating method, or the like.

For materials that can be used for the insulating film 201 and the current collector layers 202 and 206, the description regarding the EDLC 200 in FIGS. 5A to 5C is referred to.

Porous materials are preferably used for the active material layers 213 and 215. As the materials, carbon-based materials such as activated carbon and graphite can be given, for example.

The active material layers 213 and 215 may each include the above-described binders and conductive additives.

An insulating material is preferably used for the separator 214. As the insulating material, silicon oxide or the like can be given, for example.

Particles that constitute the active material layers 213 and 215 and the separator 214 are preferably deposited using a gas deposition method or gas aerosolization deposition method.

Figure 8B:
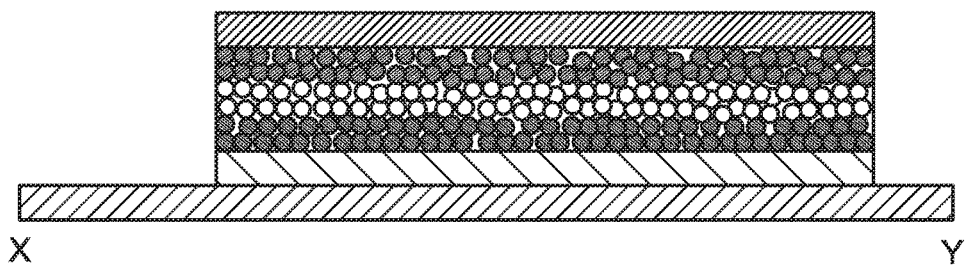

Then, the current collector layer 202, the active material layer 213, the separator 214, the active material layer 215, and the current collector layer 206 are processed into an island shape by photolithography (FIG. 8B). Note that the shape shown in FIG. 8B may be obtained with the use of a shadow mask, electron beam exposure, or the like instead of photolithography.

Figure 8C:
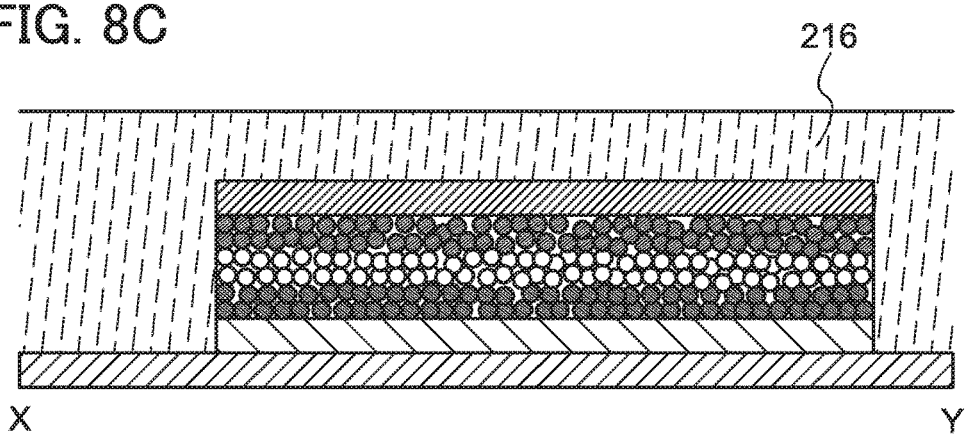

Then, an electrolytic solution 216 is dropped such that the active material layer 213, the separator 214, and the active material layer 215 are soaked in the electrolytic solution 216 (FIG. 8C).

The electrolytic solution 216 has a function of an electrolyte of the EDLC 220. The electrolytic solution 216 preferably contains an ionic liquid (also referred to as a room temperature molten salt) that has non-flammability and non-volatility. Either one kind of ionic liquid or a combination of some kinds of ionic liquids is used. The use of the electrolytic solution 216 containing an ionic liquid can prevent a power storage element from exploding or catching fire even when the power storage element internally shorts out or the internal temperature increases owing to overcharging or the like. An ionic liquid is composed of a cation and an anion. The ionic liquid of one embodiment of the present invention includes an organic cation and an anion. Examples of the organic cation include aromatic cations such as an imidazolium cation and a pyridinium cation and aliphatic onium cations such as a quaternary ammonium cation, a tertiary sulfonium cation, and a quaternary phosphonium cation. Examples of the anion include a monovalent amide-based anion, a monovalent methide-based anion, a fluorosulfonate anion, a perfluoroalkylsulfonate anion, tetrafluoroborate, perfluoroalkylborate, hexafluorophosphate, and perfluoroalkylphosphate.

As an example of the imidazolium cation, an ethylmethylimidazolium (EMI) cation can be given.

As an example of the quaternary ammonium cation, an N-methyl-N-propylpyrrolidinium (P13) cation or an N-methyl-N-propylpiperidinium (PP 13) cation can be given.

Furthermore, an aprotic organic solvent may be mixed into any of the above ionic liquids. As the aprotic organic solvent, for example, one of ethylene carbonate (EC), propylene carbonate (PC), butylene carbonate, chloroethylene carbonate, vinylene carbonate, γ-butyrolactone, γ-valcrolactone, dimethyl carbonate (DMC), diethyl carbonate (DEC), ethyl methyl carbonate (EMC), methyl formate, methyl acetate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

Furthermore, an additive agent such as vinylene carbonate, propane sultone (PS), tert-butylbenzene (TBB), fluoroethylene carbonate (FEC), or LiBOB may be added to the electrolytic solution 216. The concentration of such an additive agent in the whole solvent is, for example, higher than or equal to 0.1 wt % and lower than or equal to 5 wt %.

Furthermore, a solute containing lithium ions may be added to the electrolytic solution 216. As the solute, for example, one or plural lithium salts such as $LiPF_6$, $LiClO_4$, $LiAsF_6$, $LiBF_4$, $LiAlCl_4$, $LiSCN$, $LiBr$, $LiI$, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, and $LiN(C_2F_5SO_2)_2$, can be used in an appropriate combination and in an appropriate ratio.

The electrolytic solution 216 is preferably highly purified and contains a small amount of dust particles and elements other than the constituent elements of the electrolytic solution (hereinafter, also simply referred to as impurities). Specifically, the weight ratio of impurities to the electrolyte solution is less than or equal to 1%, preferably less than or equal to 0.1%, and more preferably less than or equal to 0.01%.

The process corresponding to FIG. 8C is preferably performed under a reduced pressure atmosphere. A reduced pressure atmosphere allows gasses contained in the active material layer 213, the separator 214, and the active material layer 215 to be released outside the element and the electrolytic solution 216 to penetrate into the element owing to capillary action.

Since the electrolytic solution 216 contains an ionic liquid, it has high viscosity, and it remains inside the element without leaking out even under a reduced pressure.

Figure 8D:
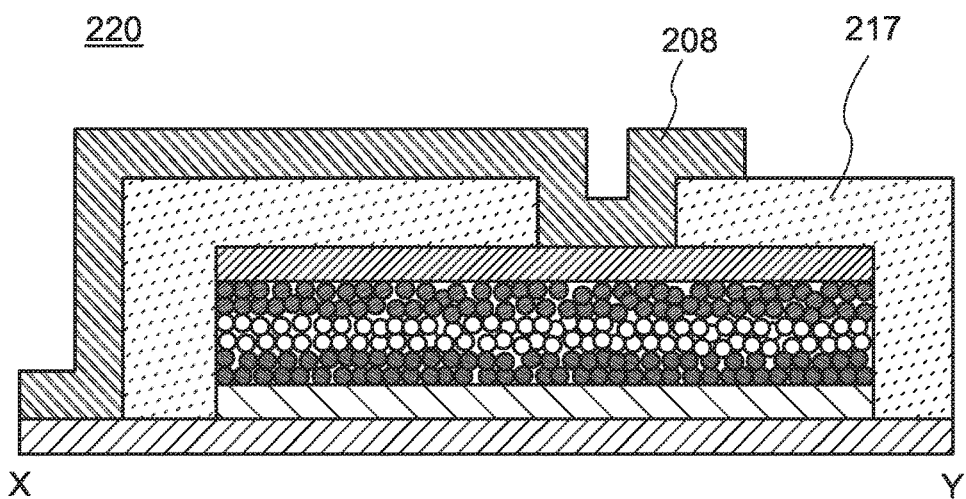

Lastly, the insulating film 217 and the wiring 208 are formed (FIG. 8D).

For the wiring 208, the description of the EDLC 200 in FIGS. 5A to 5C is referred to.

The insulating film 217 functions as a protective layer of the EDLC 220. The oxide insulating film 217 can be formed using an inorganic insulating film containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, an organic resin such as a polyimide resin, a polyamide resin, an acrylic resin, a siloxane resin, an epoxy resin, or a phenol resin can also be used.

In particular, it is preferable that the insulating film 217 not react with the electrolytic solution 216. Therefore, among the above-listed insulators, any of the inorganic insulating films is preferably used as the insulating film 217.

The electrolytic solution 216 containing an ionic liquid has low volatility, and does not react with water to deteriorate. Therefore, as long as the EDLC 220 does not include another material that reacts with water to deteriorate, the EDLC 220 may be exposed to the air. In that case, the insulating film 217 need not be provided.

In the case where the EDLC 220 contains a material that reacts with water to deteriorate, the EDLC 220 is placed in an environment where a reduced pressure is maintained, whereby long-term reliability of the EDLC 220 can be obtained even without the insulating film 217.

Fabricating the EDLC 220 with the above-described structures leads to a safer, more reliable power storage element. In addition, a minute power storage element having a high affinity for a semiconductor element can be provided.

Structural Example 4 of Power Storage Element

Figure 9A:
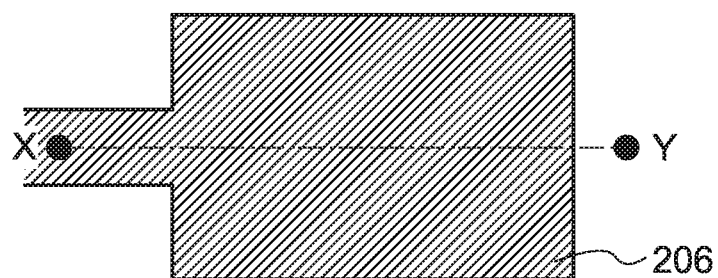
FIG. 9A is a top view and FIG. 9B is a cross-sectional view showing a structural example of an electric double-layer capacitor.
Figure 9B:
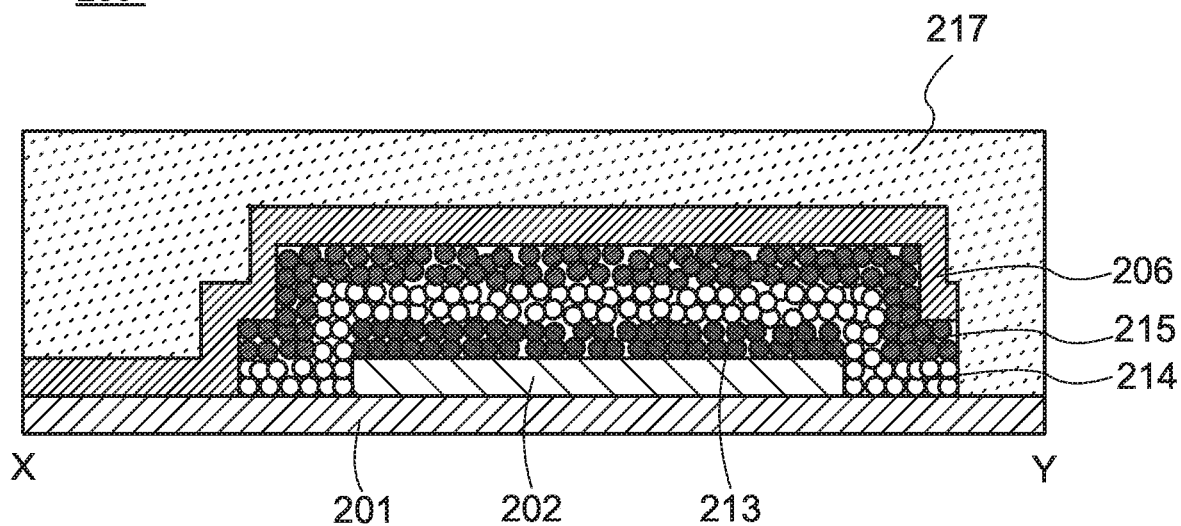

FIG. 9A is a top view of an EDLC 230, and FIG. 9B shows a cross-sectional view taken along the dashed-dotted line X-Y in FIG. 9A. In FIG. 9A, some components are increased or reduced in size, or omitted for easy understanding.

The EDCL 230 in FIGS. 9A and 9B is different from the EDLC 220 in FIGS. 7A and 7B in that a separator 214, an active material layer 215, and a current collector layer 206 are formed after a current collector layer 202 and an active material layer 213 are processed into an island shape. Such a structure can prevent a positive electrode and a negative electrode from being short-circuited. In addition, the EDLC 230 is different from the EDLC 220 in that the current collector layer 206 is used as a lead wiring. Such a structure can simplify the fabrication process.

For the other components, the description regarding the EDLC 220 in FIGS. 7A and 7B is referred to.

Fabricating the EDLC 230 with the above-described structures leads to a safer, more reliable power storage element. In addition, a minute power storage element having a high affinity for a semiconductor element can be provided.

Structural Example 5 of Power Storage Element

Figure 10A:
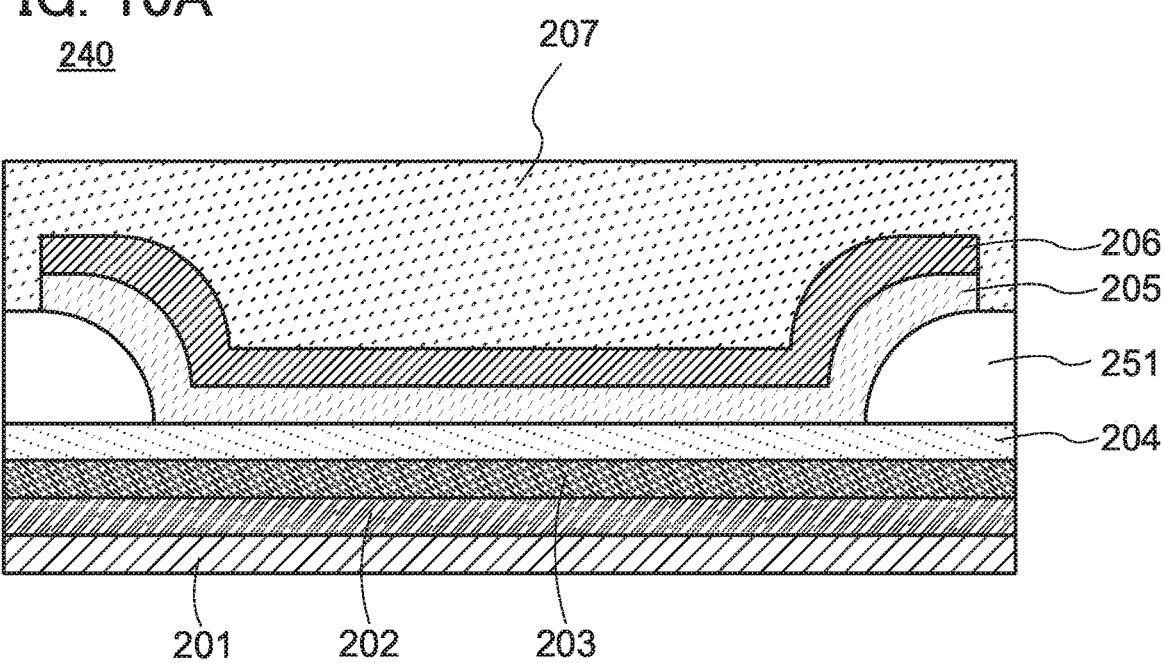
FIGS. 10A and 10B are cross-sectional views showing structural examples of an electric double-layer capacitor.

An EDLC 240 in FIG. 10A includes an insulating film 201, a current collector layer 202 formed over the insulating film 201, an active material layer 203 formed over the current collector layer 202, an electrolyte layer 204 formed over the active material layer 203, an insulating film 251 formed over the electrolyte layer 204, an active material layer 205 formed over the electrolyte layer 204 and the insulating film 251, and a current collector layer 206 formed over the active material layer 205. The current collector layer 202 and the active material layer 203 function as one of a positive electrode and a negative electrode, and the current collector layer 206 and the active material layer 205 function as the other of the positive electrode and the negative electrode. Further, an insulating film 207 is formed at least over the current collector layer 206.

In the EDLC 240 in FIG. 10A, the insulating film 251 provided between the electrolyte layer 204 and the active material layer 205 can prevent the positive electrode and the negative electrode from being short-circuited.

The insulating film 251 can be formed using, for example, an organic resin or an inorganic insulating material. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. In particular, a photosensitive resin is preferably used for easy formation of the insulating film 251. There is no particular limitation on the method for forming the insulating film 251. A photolithography method, a sputtering method, an evaporation method, a droplet discharging method (e.g., an inkjet method), a printing method (e.g., a screen printing method or an offset printing method), or the like can be used.

For the details of the other components of the EDLC 240, the description of the EDLC 200 in FIGS. 5A to 5C is referred to.

Figure 10B:
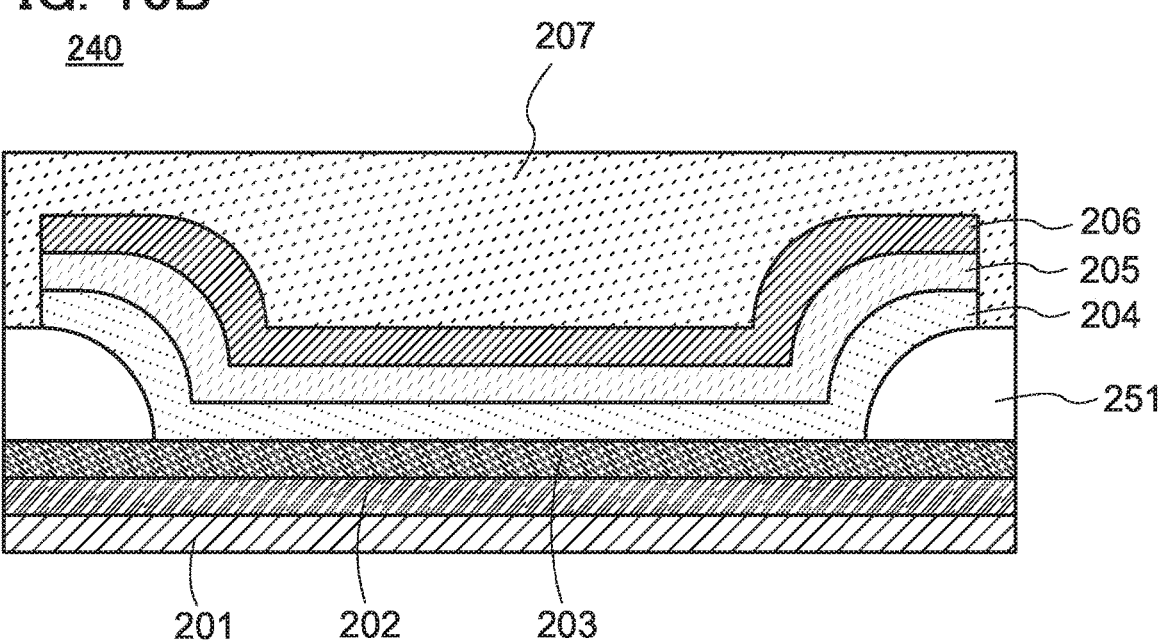

In the EDLC 240, the insulating film 251 may be formed over the active material layer 203, as shown in FIG. 10B.

Fabricating the EDLC 240 with the above-described structures leads to a safer, more reliable power storage element. In addition, a minute power storage element having a high affinity for a semiconductor element can be provided.

The structure and method described in this embodiment can be implemented by being combined as appropriate with any of the other structures and methods described in the other embodiments.

Embodiment 3

In this embodiment, an example of a transistor which can be used as the transistor 730 described in Embodiment 1 will be described.

Structural Example 1 of Transistor

Figure 11A:
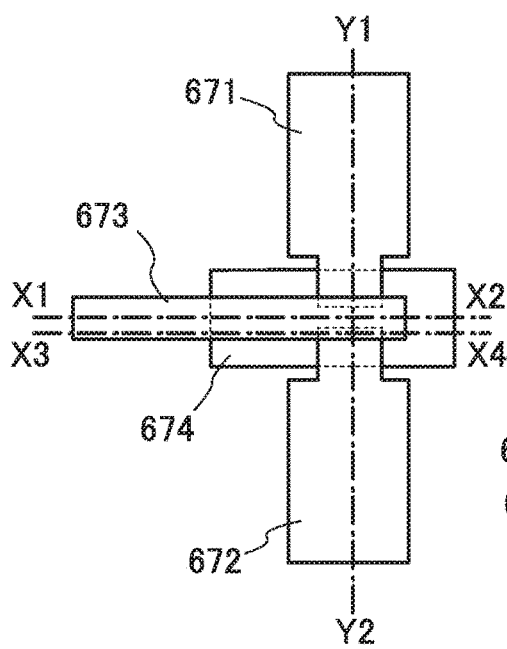
FIG. 11A is a top view and FIGS. 11B to 11D are cross-sectional views showing structural examples of a transistor.
Figure 11B:
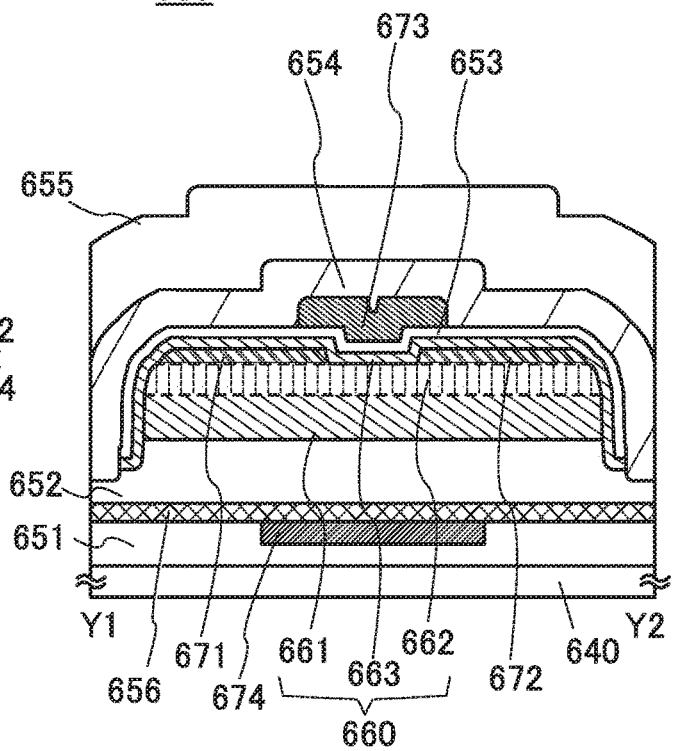
Figure 11C:
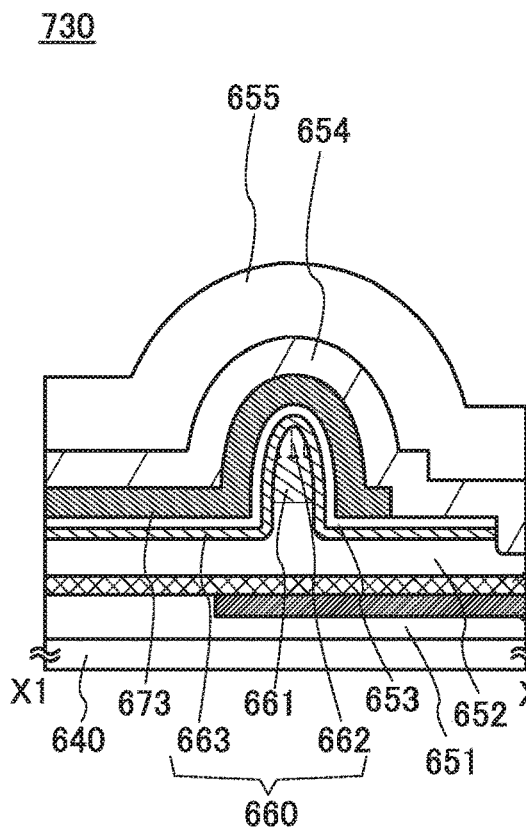
Figure 11D:
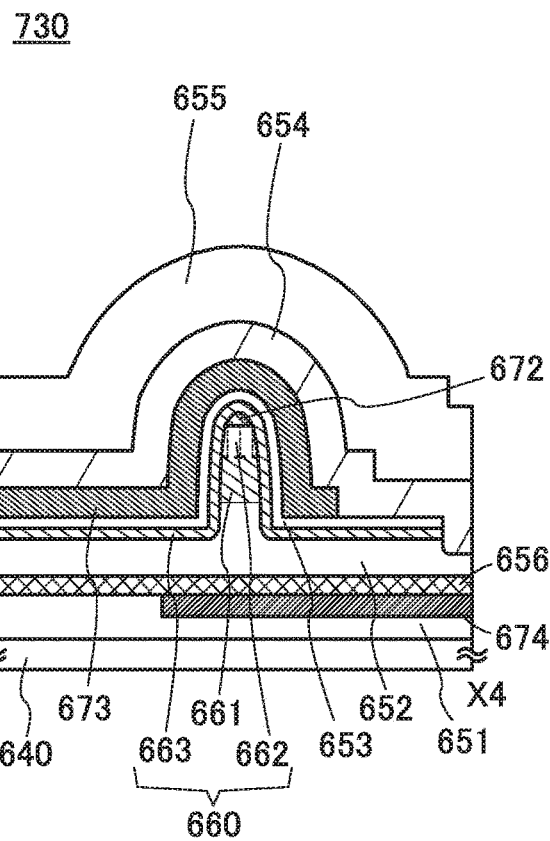

FIGS. 11A to 11D are a top view and cross-sectional views which illustrate the transistor 730. FIG. 11A is the top view. FIG. 11B corresponds to a cross section taken along the dashed-dotted line Y1-Y2 in FIG. 11A. FIG. 11C corresponds to a cross section taken along the dashed-dotted line X1-X2 in FIG. 11A. FIG. 11D corresponds to a cross section taken along the dashed-dotted line X3-X4 in FIG. 11A. In FIGS. 11A to 11D, some components are increased or reduced in size, or omitted for easy understanding. In some cases, the direction of the dashed-dotted line Y1-Y2 is referred to as a channel length direction and the direction of the dashed-dotted line X1-X2 is referred to as a channel width direction.

Note that a channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or a region where a channel is formed in a top view of the transistor. In one transistor, channel lengths in all regions are not necessarily the same. In other words, a channel length of one transistor is not limited to one value in some cases. Therefore, in this specification, a channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions do not necessarily the same. In other words, a channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a minute transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The transistor 730 includes a substrate 640; an insulating film 651 over the substrate 640; a conductive film 674 formed over the insulating film 651; an insulating film 656 formed over the insulating film 651 and the conductive film 674; an insulating film 652 formed over the insulating film 656; a semiconductor 661 and a semiconductor 662 stacked over the insulating film 652 in this order; a conductive film 671 and a conductive film 672 in contact with a top surface of the semiconductor 662; a semiconductor 663 in contact with the semiconductor 661, the semiconductor 662, the conductive film 671, and the conductive film 672; an insulating film 653 and a conductive film 673 over the semiconductor 663; an insulating film 654 over the conductive film 673 and the insulating film 653; and an insulating film 655 over the insulating film 654. Note that the semiconductor 661, the semiconductor 662, and the semiconductor 663 are collectively referred to as a semiconductor 660.

The conductive film 671 has a function of a source electrode of the transistor 730. The conductive film 672 has a function of a drain electrode of the transistor 730.

The conductive film 673 has a function of a first gate electrode of the transistor 730.

The insulating film 653 has a function of a first gate insulating film of the transistor 730.

The conductive film 674 has a function of a second gate electrode of the transistor 730.

The insulating film 656 and the insulating film 652 have a function of a second gate insulating film of the transistor 730.

The conductive film 674 and the conductive film 673 may be supplied with different potentials, or supplied with the same potentials at the same time. Further, the conductive film 674 may be omitted in some cases.

As illustrated in FIG. 11C, a side surface of the semiconductor 662 is surrounded by the conductive film 673. With such a structure, the semiconductor 662 can be electrically surrounded by an electric field of the conductive film 673 (a structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that high current in an on state (on-state current) can be achieved. The s-channel structure enables a transistor to operate at high frequency.

The s-channel structure, because of its high on-state current, is suitable for a semiconductor device such as large-scale integration (LSI) which requires a miniaturized transistor. A semiconductor device including the miniaturized transistor can have a high integration degree and high density. The transistor preferably has, for example, a region where a channel length is greater than or equal to 10 nm and less than 1 μm, more preferably greater than or equal to 10 nm and less than 100 nm, still more preferably greater than or equal to 10 nm and less than 60 nm, and yet still more preferably greater than or equal to 10 nm and less than 30 nm.

Since high on-state current can be obtained, the s-channel structure is suitable for a transistor that needs to operate at high frequency. A semiconductor device including the transistor can operate at high frequency.

In addition, the s-channel structure is suitable for a power control transistor because of its high on-state current. To employ the s-channel structure in the power control transistor that requires a high withstand voltage, the channel length is preferably long. For example, the transistor preferably has a region where the channel length is greater than or equal to 1 μm, more preferably greater than or equal to 10 μm, and still more preferably greater than or equal to 100 μm.

<Substrate>

As the substrate 640, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used.

As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

A flexible substrate may be used as the substrate 640. As a method for providing a transistor over a flexible substrate, there is a method in which a transistor is formed over a non-flexible substrate, and then the transistor is separated and transferred to the substrate 640 that is a flexible substrate. In that case, a separation layer is preferably provided between the non-flexible substrate and the transistor. As the substrate 640, a sheet, a film, or foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 640 has small thickness, the weight of the semiconductor device can be reduced. When the substrate 640 has small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the flexible substrate 640, metal, an alloy, resin, glass, or fiber thereof can be used, for example. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 640 because of its low coefficient of linear expansion.

<Base Insulating Film>

The insulating film 651 has a function of electrically isolating the substrate 640 and the conductive film 674 from each other.

As a material for the insulating film 651, a material containing silicon oxide, silicon nitride, silicon oxynitride, or silicon nitride oxide is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used. Note that in this specification, "oxynitride" refers to a material that contains oxygen at a higher proportion than nitrogen, and "nitride oxide" refers to a material that contains nitrogen at a higher proportion than oxygen.

Alternatively, silicon oxide with favorable step coverage which is formed through reaction between TEOS, silane, or the like and oxygen, nitrous oxide, or the like may be used as the insulating film 651.

The insulating film 651 may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

In the case where a semiconductor substrate is used as the substrate 640, the insulating film 651 may be a thermal oxide film.

The conductive film 674 preferably has a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (1r), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film 674 is preferably formed using a low-resistance conductive material such as aluminum or copper. The conductive film 674 is preferably formed using a Cu—Mn alloy, since in that case, manganese oxide formed at the interface with an insulator containing oxygen has a function of preventing Cu diffusion.

The conductive film 674 can be formed by a sputtering method, a CVD method (including a thermal CVD method, an MOCVD method, a PECVD method, and the like), an MBE method, an ALD method, a PLD method, or the like.

The insulating film 652 preferably contains an oxide. In particular, the insulating film 652 preferably contains an oxide material from which part of oxygen is released by heating. The insulating film 652 preferably contains an oxide containing oxygen in excess of that in the stoichiometric composition. Part of oxygen is released due to heating from an oxide film containing oxygen in excess of that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

For example, for the insulating film 652, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

To make the insulating film 652 contain excess oxygen, the insulating film 652 may be formed in an oxygen atmosphere, for example. Alternatively, a region containing excess oxygen may be formed by introducing oxygen into the insulating film 652 that has been formed. Both the methods may be combined.

For example, oxygen (including at least one of an oxygen radical, an oxygen atom, and an oxygen ion) is introduced into the insulating film 652 that has been formed, so that a region containing excess oxygen is formed. Oxygen can be introduced by an ion implantation method, an ion doping method, a plasma immersion ion implantation method, plasma treatment, or the like.

A gas containing oxygen can be used for oxygen introduction treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Furthermore, hydrogen or the like may be included. For example, a mixed gas of carbon dioxide, hydrogen, and argon may be used.

After the insulating film 652 is formed, the insulating film 652 may be subjected to planarization treatment using a CMP method or the like to improve the planarity the top surface thereof.

The insulating film 656 may be provided between the conductive film 674 and the insulating film 652. The insulating film 656 has a function of preventing oxygen contained in the insulating film 652 from decreasing by bonding to metal contained in the conductive film 674.

The insulating film 656 preferably has a blocking effect against oxygen, hydrogen, water, alkali metal, alkaline earth metal, and the like. The insulating film 656 can be, for example, a nitride insulating film. The nitride insulating film is formed using silicon nitride, silicon nitride oxide, aluminum nitride, aluminum nitride oxide, or the like. An oxide insulating film may be provided instead of the nitride insulating film. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

<Semiconductor>

Next, a semiconductor that can be used as the semiconductor 661, the semiconductor 662, the semiconductor 663, or the like will be described.

In the transistor 730, it is preferable that current flowing between a source and a drain in an off state (off-state current) be low. Here, the term "low off-state current" means that a normalized off-state current per micrometer of a channel width at room temperature with a source-drain voltage of 10 V is less than or equal to $10 \times 10^{-21}$ A. An example of a transistor with such low off-state current is a transistor including an oxide semiconductor as a semiconductor.

The semiconductor 662 is an oxide semiconductor containing indium (In), for example. The semiconductor 662 can have high carrier mobility (electron mobility) by containing indium, for example. The semiconductor 662 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Cc), neodymium (Nd), hafnium (HO, tantalum (Ta), tungsten (W), and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the oxide semiconductor, for example. Furthermore, the semiconductor 662 preferably contains zinc (Zn). When the oxide semiconductor contains zinc, the oxide semiconductor is easily crystallized in some cases.

Note that the semiconductor 662 is not limited to the oxide semiconductor containing indium. The semiconductor 662 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 662, an oxide with a wide energy gap is used. The energy gap of the semiconductor 662 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 662 is preferably a CAAC-OS film which will be described later.

For example, the semiconductor 661 and the semiconductor 663 are oxide semiconductors each including one or more, or two or more elements other than oxygen included in the semiconductor 662. Since the semiconductor 661 and the semiconductor 663 each include one or more, or two or more elements other than oxygen included in the semiconductor 662, an interface state is less likely to be formed at the interface between the semiconductor 661 and the semiconductor 662 and the interface between the semiconductor 662 and the semiconductor 663.

In the case where the semiconductor 661 is an In-M-Zn oxide, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. In the case where the semiconductor 661 is formed by a sputtering method, it is preferable to use a sputtering target that satisfies the above composition. For example, as the atomic ratio of the sputtering target, In:M:Zn=1:3:2 is preferably satisfied.

In the case where the semiconductor 662 is an In-M-Zn oxide, when the total proportion of in and M is assumed to be 100 atomic %, the proportions of In and M are preferably set to be higher than 25 atomic % and lower than 75 atomic %, respectively, more preferably higher than 34 atomic % and lower than 66 atomic %, respectively. In the case where the semiconductor 662 is formed by a sputtering method, it is preferable to use a sputtering target that satisfies the above composition. For example, as the atomic ratio of the sputtering target, In:M:Zn=1:1:1, In:M:Zn=1:1:1.2, In:M:Zn=2:1:3, In:M:Zn=3:1:2, or In:M:Zn=4:2:4.1 is preferably satisfied. In particular, when a sputtering target with an atomic ratio of In to Ga and Zn of 4:2:4.1 is used, the atomic ratio of In to Ga and Zn in the semiconductor 662 may be 4:2:3 or in the neighborhood of 4:2:3.

In the case where the semiconductor 663 is an In-M-Zn oxide, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. The semiconductor 663 may be an oxide that is the same type as that of the semiconductor 661. Note that the semiconductor 661 and/or the semiconductor 663 need not necessarily contain indium in some cases. For example, the semiconductor 661 and/or the semiconductor 663 may be gallium oxide.

Figure 12A:
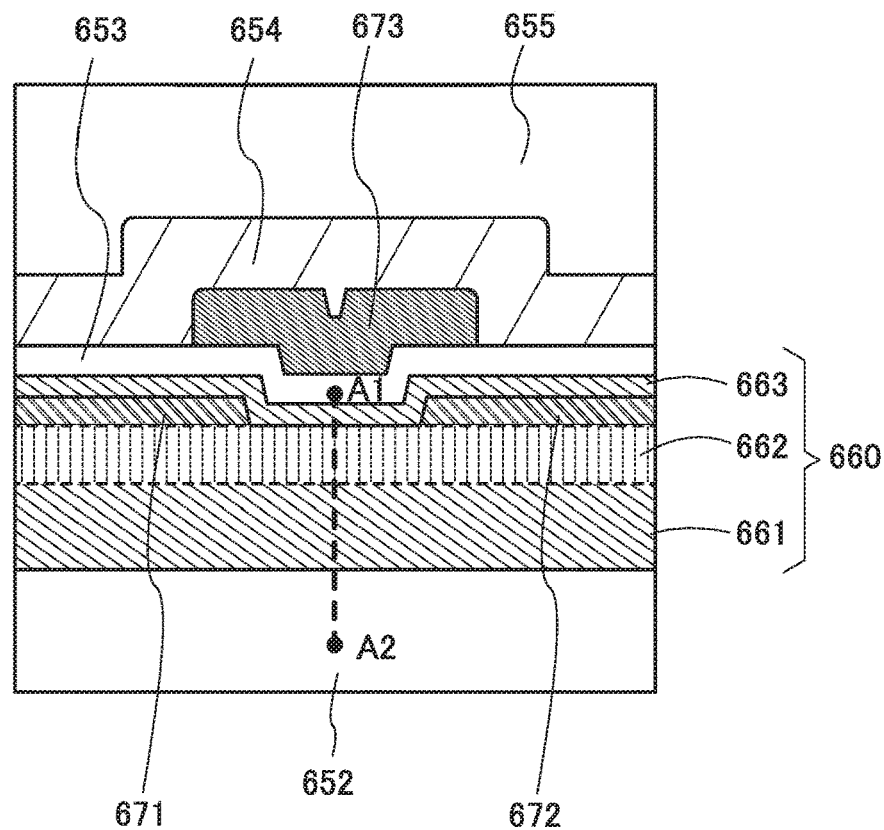
FIG. 12A is a cross-sectional view showing a structural example of a transistor and FIG. 12B is an energy band diagram of the transistor.
Figure 12B:
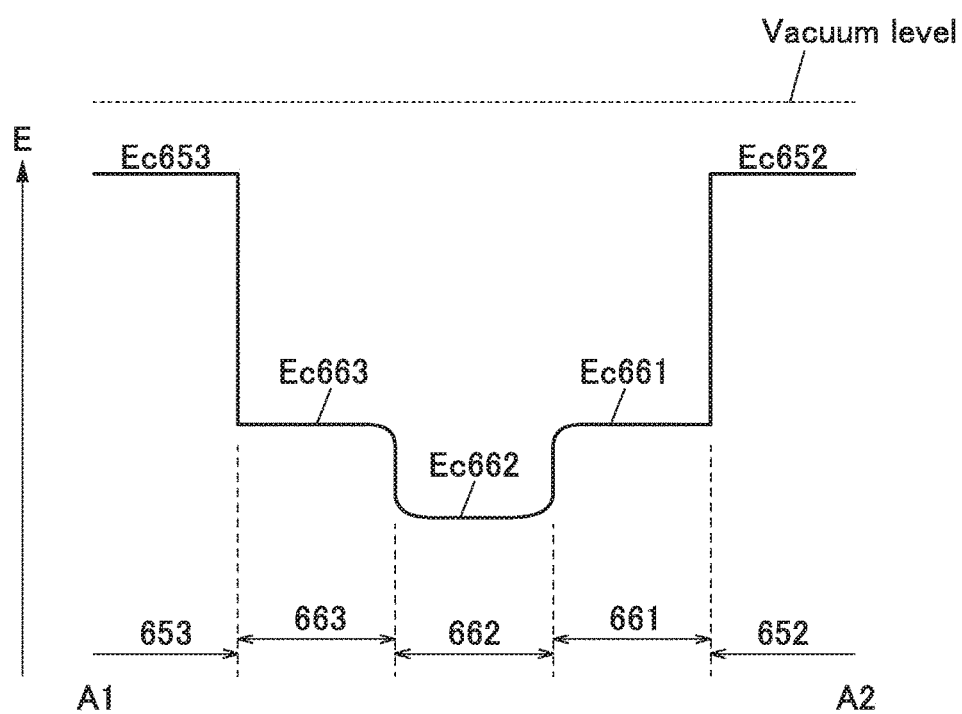

Next, a function and an effect of the semiconductor 660 in which the semiconductors 661 to 663 are stacked will be described using an energy band diagram in FIG. 12B. FIG. 12A is an enlarged view of the channel portion of the transistor 730 in FIG. 11B. FIG. 12B shows an energy band diagram of a portion along the chain line A1-A2 in FIG. 12A. That is, FIG. 12B shows the energy band structure of a channel region of the transistor 730.

In FIG. 12B, Ec652, Ec661, Ec662, Ec663, and Ec653 indicate the energy at the bottom of the conduction band of the insulating film 652, the semiconductor 661, the semiconductor 662, the semiconductor 663, and the insulating film 653, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 652 and 653 are insulators, Ec652 and Ec653 are closer to the vacuum level than Ec661 to Ec663 (i.e., the insulating films 652 and 653 have lower electron affinity than the semiconductors 661 to 663).

As the semiconductor 662, an oxide having an electron affinity higher than those of the semiconductors 661 and 663 is used. For example, as the semiconductor 662, an oxide having an electron affinity higher than those of the semiconductors 661 and 663 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

An indium gallium oxide has a small electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the semiconductor 662 having the highest electron affinity in the semiconductors 661 to 663.

Here, in some cases, there is a mixed region of the semiconductors 661 and 662 between the semiconductors 661 and 662. Furthermore, in some cases, there is a mixed region of the semiconductors 662 and 663 between the semiconductors 662 and 663. The mixed region has a low density of interface states. For that reason, the stack of the semiconductors 661 to 663 has a band structure where energy at each interface is changed continuously (continuous junction).

At this time, electrons move mainly in the semiconductor 662, not in the semiconductors 661 and 663. As described above, when the interface state density at the interface between the semiconductors 661 and 662 and the interface state density at the interface between the semiconductors 662 and 663 are decreased, electron movement in the semiconductor 662 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to move efficiently. Electron movement is inhibited, for example, in the case where physical unevenness in a channel region is large.

To increase the on-state current of the transistor, for example, root mean square (RMS) roughness with a measurement area of 1 μm×1 μM of a top surface or a bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (also referred to as P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies ($V_O$), donor levels are formed by entry of hydrogen into sites of oxygen vacancies in some cases. A state in which hydrogen enters sites of oxygen vacancies are denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, the hydrogen concentration at a certain depth of the semiconductor 662 or in a certain region of the semiconductor 662, which is measured by secondary ion mass spectrometry (SIMS), is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In this case, the semiconductor 661 is preferably a layer having an oxygen-transmitting property (a layer through which oxygen is transmitted).

In the case where the transistor has an s-channel structure, a channel is formed in the entire semiconductor 662. Therefore, as the semiconductor 662 has larger thickness, a channel region becomes larger. In other words, the thicker the semiconductor 662 is, the larger the on-state current of the transistor can be.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. Thus, the semiconductor 663 preferably has a certain thickness. For example, the semiconductor 663 has a region with a thickness of greater than or equal to 0.3 nm, preferably greater than or equal to 1 nm, more preferably greater than or equal to 2 nm. The semiconductor 663 preferably has an oxygen blocking property to inhibit outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, a distance from an interface between the adjacent insulator and the semiconductor 661 to the semiconductor 662 in which a channel is formed can be large. However, to prevent the productivity of the semiconductor device from being decreased, the semiconductor 661 has a region with a thickness of, for example, less than or equal to 200 nm, preferably less than or equal to 120 nm, more preferably less than or equal to 80 nm.

For example, a region in which the concentration of silicon measured by SIMS is higher than or equal to $1 \times 10^{16}$ atoms/cm$^3$ and lower than $1 \times 10^{19}$ atoms/cm$^3$, preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$ is provided between the semiconductors 661 and 662. Further, a region in which the concentration of silicon measured by SIMS is higher than or equal to $1 \times 10^{16}$ atoms/cm$^3$ and lower than $1 \times 10^{19}$ atoms/cm$^3$, preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$ is provided between the semiconductors 662 and 663.

It is preferable to reduce the concentration of hydrogen in the semiconductors 661 and 663 in order to reduce the concentration of hydrogen in the semiconductor 662. The semiconductors 661 and 663 each have a region in which the concentration of hydrogen measured by SIMS is higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$. It is preferable to reduce the concentration of nitrogen in the semiconductors 661 and 663 in order to reduce the concentration of nitrogen in the semiconductor 662. The semiconductors 661 and 663 each have a region in which the concentration of nitrogen measured by SIMS is higher than or equal to $1 \times 10^{16}$ atoms/cm$^3$ and lower than $5 \times 10^{19}$ atoms/cm$^3$, preferably higher than or equal to $1 \times 10^{16}$ atoms/cm$^3$ and lower than or equal to $5 \times 10^{18}$ atoms/cm$^3$, more preferably higher than or equal to $1 \times 10^{16}$ atoms/cm$^3$ and lower than or equal to $1 \times 10^{18}$ atoms/cm$^3$, still more preferably higher than or equal to $1 \times 10^{16}$ atoms/cm$^3$ and lower than or equal to $5 \times 10^{17}$ atoms/cm$^3$.

The above three-layer structure is an example. For example, a two-layer structure without the semiconductor 661 or 663 may be employed. A four-layer structure in which any one of the semiconductors described as examples of the semiconductors 661 to 663 is provided below or over the semiconductor 661 or below or over the semiconductor 663 may be employed. An n-layer structure (n is an integer of five or more) in which any one of the semiconductors described as examples of the semiconductors 661 to 663 is provided at two or more of the following positions may be employed: over the semiconductor 661, below the semiconductor 661, over the semiconductor 663, and below the semiconductor 663.

<Conductive Film>

The conductive films 671 to 673 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The conductive film is preferably formed using a Cu—Mn alloy, since in that case, manganese oxide formed at the interface with an insulator containing oxygen has a function of preventing Cu diffusion.

The conductive films 671 and 672 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The conductive films 671 to 673 can be formed by, for example, a sputtering method, a CVD method (including a thermal CVD method, an MOCVD method, a PECVD method, and the like), an MBE method, an ALD method, or a PLD method.

<Gate Insulating Film>

The insulating film 653 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack of any of the above materials. Note that the insulating film 653 may contain lanthanum (La), nitrogen, zirconium (Zr), or the like as an impurity.

An example of a stacked-layer structure of the insulating film 653 will be described. The insulating film 653 contains oxygen, nitrogen, silicon, or hafnium, for example. Specifically, the insulating film 653 preferably includes hafnium oxide and silicon oxide or silicon oxynitride.

Hafnium oxide has a higher dielectric constant than silicon oxide and silicon oxynitride. Therefore, by using hafnium oxide, the thickness of the insulating film 653 can be made larger than the case where silicon oxide is used;

thus, leakage current due to tunnel current can be low. That is, it is possible to provide a transistor with a low off-state current.

<Protective Insulating Film>

The insulating film 654 has a function of blocking oxygen, hydrogen, water, alkali metal, alkaline earth metal, and the like. The insulating film 654 can prevent outward diffusion of oxygen from the semiconductor 660 and entry of hydrogen, water, or the like into the semiconductor 660 from the outside.

The insulating film 654 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, more preferably a plasma CVD method because coverage can be further improved. It is preferable to use a thermal CVD method, an MOCVD method, or an ALD method in order to reduce plasma damage.

The insulating film 654 can be a nitride insulating film, for example. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. In addition, oxygen contained in the aluminum oxide film can be diffused into the semiconductor 660.

After the insulating film 654 is formed, heat treatment is preferably performed. Through this heat treatment, oxygen can be supplied to the semiconductor 660 from the insulating film 652 or the like; thus, oxygen vacancies in the semiconductor 660 can be reduced. Because oxygen released from the insulating film 652 is blocked by the insulating film 656 and the insulating film 654 at this time, the oxygen can be effectively confined. Thus, the amount of oxygen supplied to the semiconductor 660 can be increased, so that oxygen vacancies in the semiconductor 660 can be effectively reduced.

Next, the insulating film 655 is formed. The insulating film 655 can be formed by a sputtering method, a CVD method (including a thermal CVD method, an MOCVD method, a PECVD method, and the like), an MBE method, an ALD method, a PLD method, or the like. In particular, it is preferable that the insulating film 655 be formed by a CVD method, more preferably a plasma CVD method because coverage can be further improved. It is preferable to use a thermal CVD method, an MOCVD method, or an ALD method in order to reduce plasma damage. In the case where the insulating film 655 is formed using an organic insulating material such as an organic resin, a coating method such as a spin coating method may be used. After the insulating film 655 is formed, a top surface thereof is preferably subjected to planarization treatment.

The insulating film 655 can be formed using an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, the insulating film 655 can be formed using an organic resin such as a polyimide resin, a polyamide resin, an acrylic resin, a siloxane resin, an epoxy resin, or a phenol resin. The insulating film 655 may be a stack of any of the above materials.

Structural Example 2 of Transistor

Figure 13:
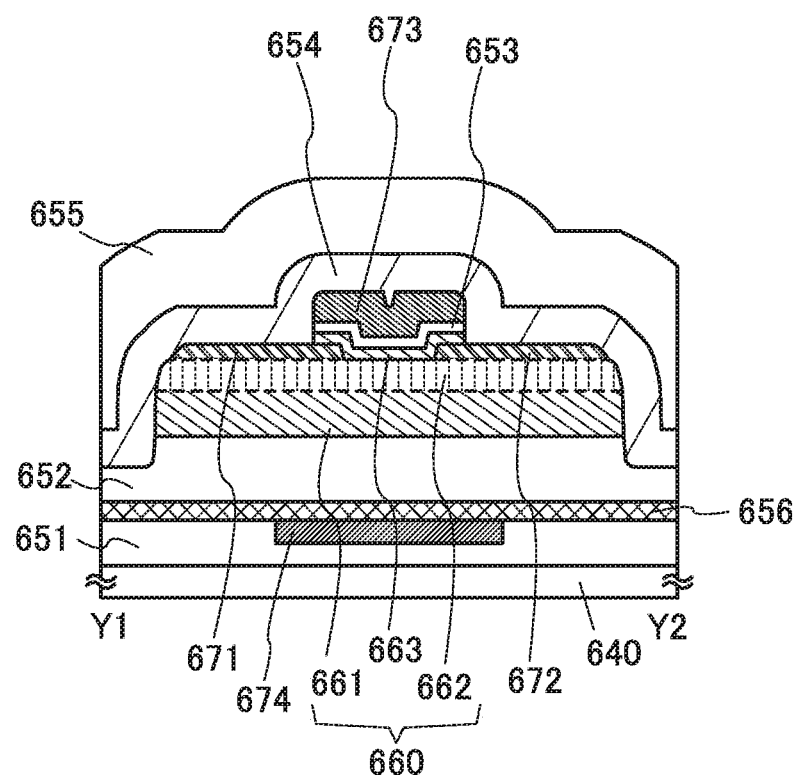
FIG. 13 is a cross-sectional view showing a structural example of a transistor.

In the transistor 730 in FIGS. 11A to 11D, the semiconductor 663 and the insulating film 653 may be etched at the same time when the conductive film 673 is formed by etching. FIG. 13 shows an example of such a case.

FIG. 13 shows the case where the semiconductor 663 and the insulating film 653 in FIG. 11B are provided only under the conductive film 673.

Structural Example 3 of Transistor

Figure 14:
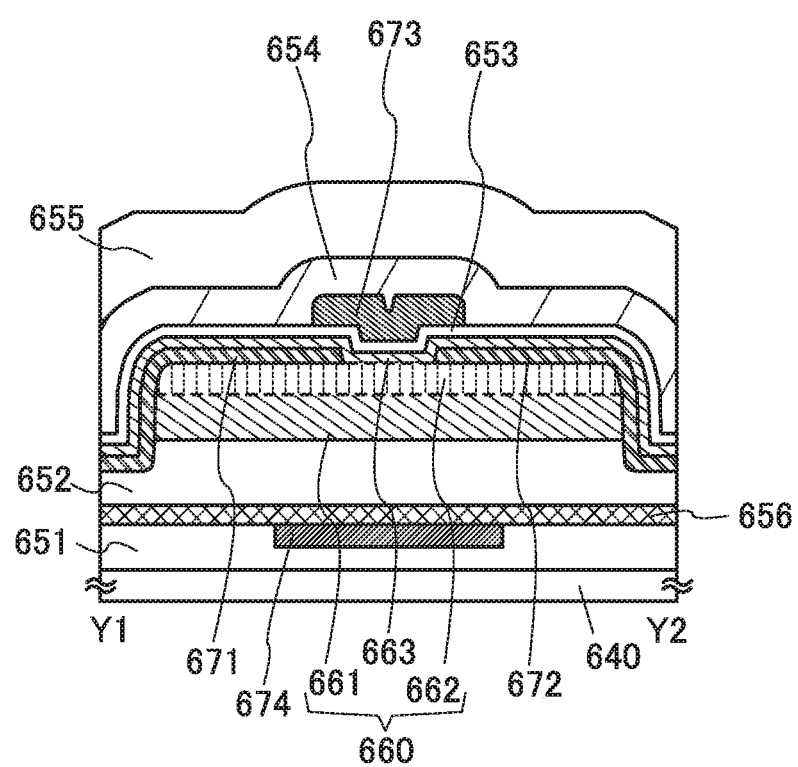
FIG. 14 is a cross-sectional view showing a structural example of a transistor.

In the transistor 730 in FIGS. 11A to 11D, the conductive films 671 and 672 may be in contact with side surfaces of the semiconductors 661 and 662. FIG. 14 shows an example of such a case.

FIG. 14 shows the case where the conductive films 671 and 672 in FIG. 11B are in contact with the side surfaces of the semiconductors 661 and 662.

Structural Example 4 of Transistor

Figure 15:
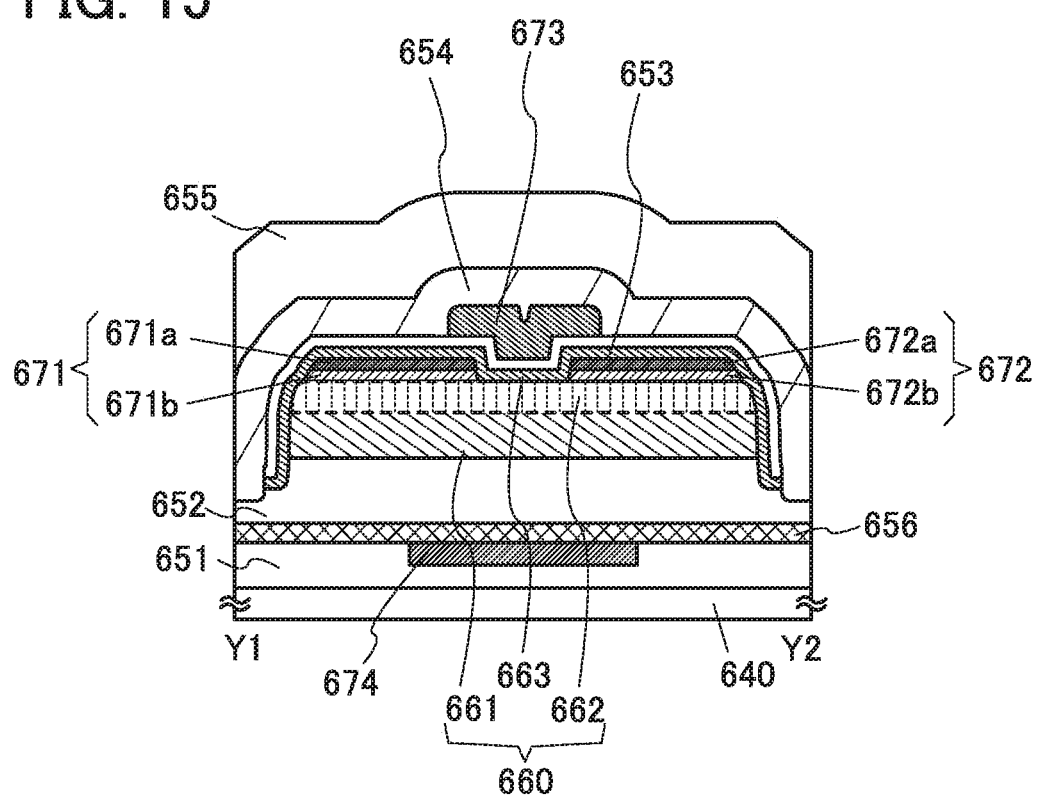
FIG. 15 is a cross-sectional view showing a structural example of a transistor.

In the transistor 730 in FIGS. 11A to 11D, the conductive film 671 may be a stack including a conductive film 671a and a conductive film 671b. Furthermore, the conductive film 672 may be a stack including a conductive film 672a and a conductive film 672b. FIG. 15 shows an example of such a case.

FIG. 15 shows the case where the conductive film 671 and the conductive film 672 in FIG. 11B are a stack including the conductive films 671a and 671b and a stack including the conductive films 672a and 672b, respectively.

The conductive films 671b and 672b may be formed using a transparent conductor, an oxide semiconductor, a nitride semiconductor, or an oxynitride semiconductor, for example. The conductive films 671b and 672b may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 671b and 672b may have a property of transmitting visible light. Alternatively, the conductive films 671b and 672b may have a property of not transmitting visible light, ultraviolet light, infrared light, or an X-ray by reflecting or absorbing it. In some cases, such a property can suppress a change in electrical characteristics of the transistor due to stray light.

The conductive films 671b and 672b may preferably be formed using a layer that does not form a Schottky barrier with the semiconductor 662 or the like. Accordingly, on-state characteristics of the transistor can be improved.

The conductive films 671a and 672a may each have a single-layer structure or a stacked-layer structure of a conductor containing, for example, one or more of the following: boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671b and 672b preferably have higher resistance than the conductive films 671a and 672a according to circumstances. The conductive films 671b and 672b preferably have lower resistance than the channel of the transistor according to circumstances. For example, the conductive films 671b and 672b may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωm and lower than or equal to 10 Ωcm. The conductive films 671b and 672b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 671b and 672b (e.g., the film on the drain side) is preferably provided according to circumstances.

<Crystal Structure of Oxide Semiconductor>

Next, the crystal structure of an oxide semiconductor that can be used for the semiconductor 662 will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100° and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a form that reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, for example, a grain boundary cannot be found clearly in the nc-OS film sometimes.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers, including three In—O layers and six Ga—Zn—O layers, are layered in the c-axis direction. Accordingly, the spacing between these adjacent layers is equivalent to the lattice spacing on the (009) plane (also referred to as d value). The value is calculated to be 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description will be given. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

The structure and method described in this embodiment can be implemented by being combined as appropriate with any of the other structures and methods described in the other embodiments.

Embodiment 4

In this embodiment, electronic devices of embodiments of the present invention will be described with reference to FIGS. 16A to 16F.

FIGS. 16A to 16F illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 16A:
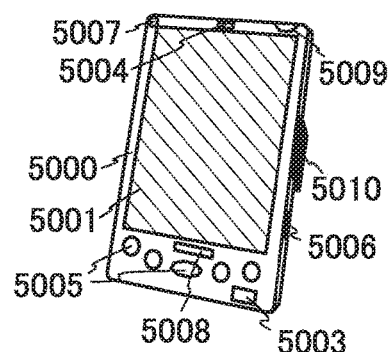
FIGS. 16A to 16F are perspective views each showing an example of an electronic device.
Figure 16B:
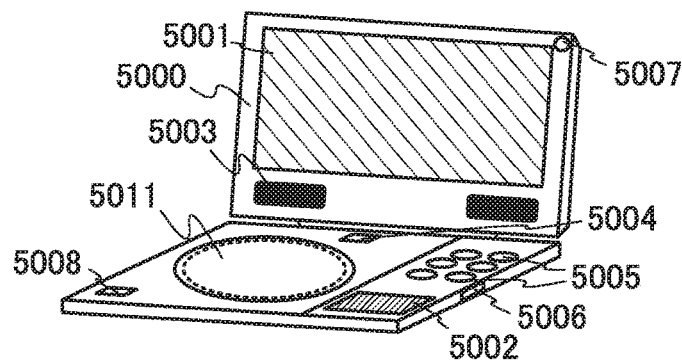
Figure 16C:
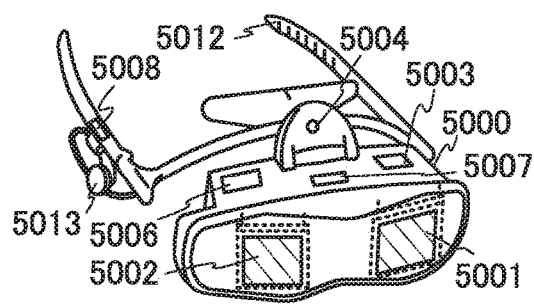
Figure 16D:
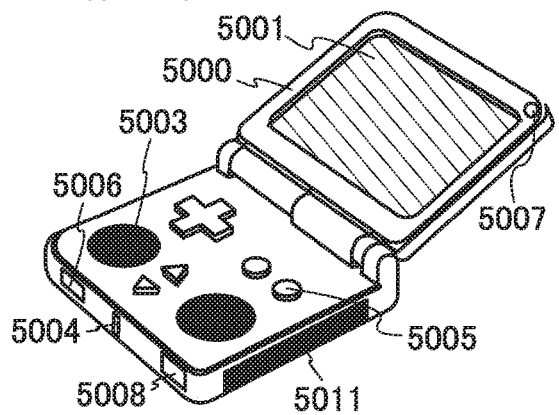
Figure 16E:
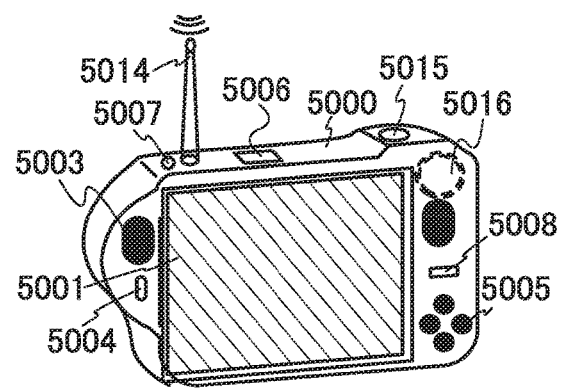
Figure 16F:
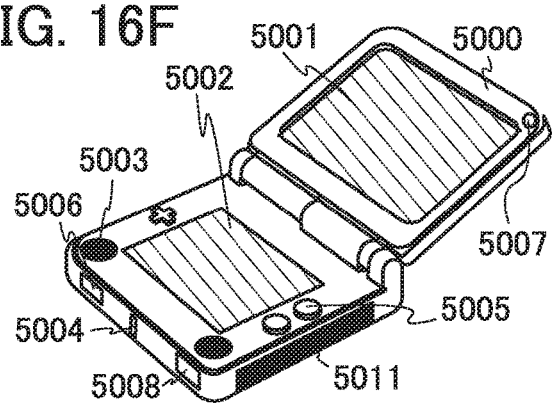

FIG. 16A illustrates a mobile computer, which can include a switch 5009, an infrared port 5010, and the like in addition to the above components. FIG. 16B illustrates a portable image reproducing device (e.g., a DVD player), which is provided with a memory medium and can include a second display portion 5002, a memory medium reading portion 5011, and the like in addition to the above components. FIG. 16C illustrates a goggle-type display, which can include the second display portion 5002, a support 5012, an earphone 5013, and the like in addition to the above components. FIG. 16D illustrates a portable game machine, which can include the memory medium reading portion 5011 and the like in addition to the above components. FIG. 16E illustrates a digital camera, which has a television reception function and can include an antenna 5014, a shutter button 5015, an image receiving portion 5016, and the like in addition to the above components. FIG. 16F illustrates a portable game machine, which can include the second display portion 5002, the memory medium reading portion 5011, and the like in addition to the above components.

The electronic devices illustrated in FIGS. 16A to 16F can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information on another display portion, a function of displaying a three-dimensional image by displaying images where parallax is utilized on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions that can be provided for the electronic devices illustrated in FIGS. 16A to 16F are not limited thereto, and the electronic devices can have a variety of functions.

Each of the electronic devices described in this embodiment incorporates a plurality of power storage elements and has a wireless receiving portion capable of wireless charging.

Figure 17A:
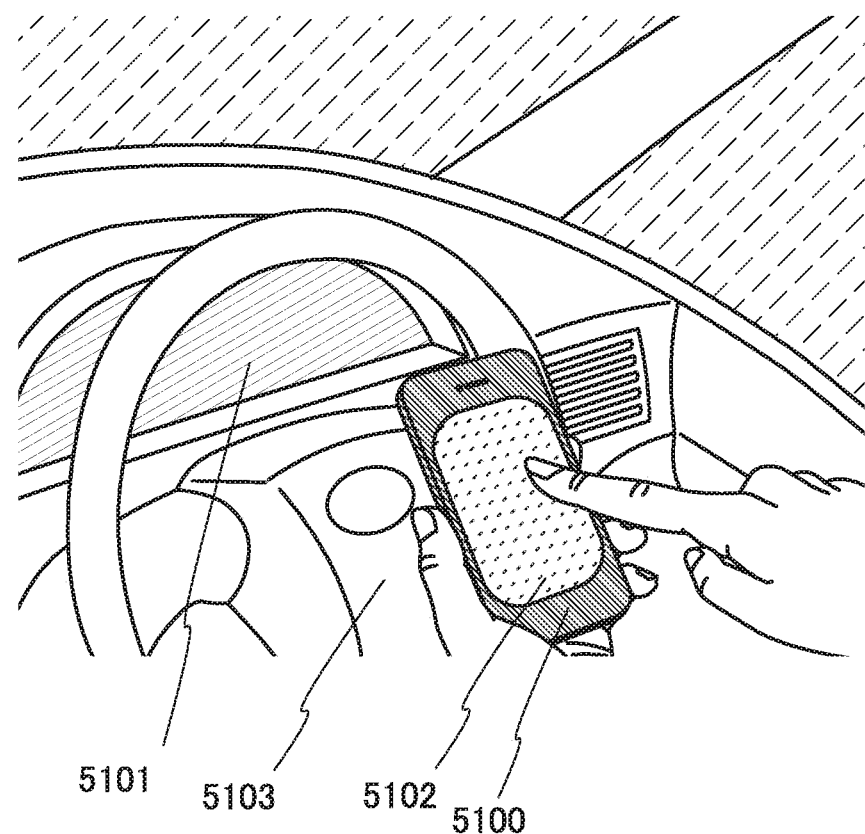
FIGS. 17A and 17B each illustrate an example of an electronic device.
Figure 17B:
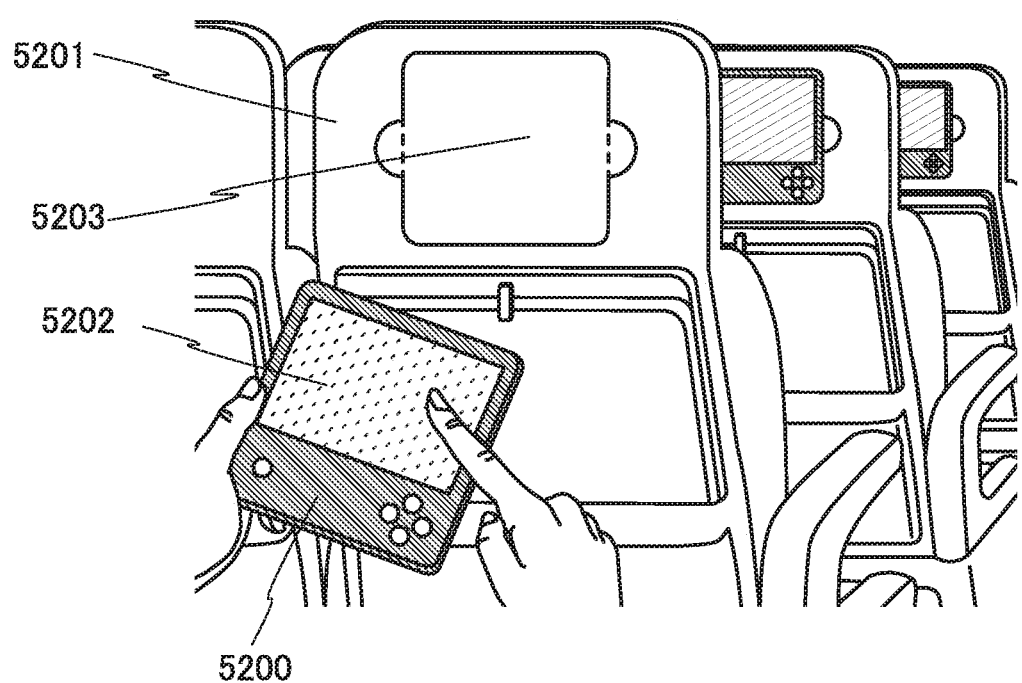

Usage examples of electronic devices are illustrated in FIGS. 17A and 17B.

FIG. 17A shows an example where an information terminal is operated in a moving object such as a car.

The numeral 5103 indicates a steering wheel, which includes an antenna inside. The antenna in the steering wheel 5103 can supply electric power to an electronic device 5100. The electronic device 5100 has a plurality of power storage elements, and at least one of the power storage elements is charged by wireless charging. The steering wheel 5103 may be provided with a jig that can fix the electronic device 5100. If the electronic device 5100 is fixed on the steering wheel 5103, the user can make a phone call or a video-phone call without using his/her hands. Furthermore, through voice authentication with the use of a microphone provided in the electronic device 5100, the car can be driven by a voice of the driver.

For example, by operating the electronic device 5100 while the car is parked, the positional information can be displayed on a display portion 5102. Furthermore, information not displayed on a display portion 5101 of the car, such as engine speed, steering wheel angle, temperature, and tire pressure may be displayed on the display portion 5102. The display portion 5102 has a touch input function. Furthermore, one or more cameras to image the outside of the car can be used to display the outside image on the display portion 5102. That is, the display portion 5102 can be used as a back monitor, for example. Furthermore, for preventing drowsy driving, the electronic device 5100 may operate as follows, for example: while wirelessly receiving information such as the driving speed from the car to monitor the driving speed, the electronic device 5100 images the driver at the time of driving and when a period for which the driver closes his/her eyes is long, it vibrates, beeps, or plays music (depending on the setting that can be selected by the driver as appropriate). Furthermore, by stopping imaging the driver while the car is parked, power consumption can be reduced. In addition, the power storage elements of the electronic device 5100 may be wirelessly charged while the car is parked.

The electronic device 5100 is expected to be used in a variety of ways in a moving object such as a car, as described above, and is desired to incorporate a number of sensors and a plurality of antennas that enable various functions thereof. Although a moving object such as a car has a power supply, the power supply is limited. In view of the electric power to drive the moving object, it is preferable that the electric power used for the electronic device 5100 be as low as possible. For an electric vehicle, in particular, power consumed by the electronic device 5100 may decrease the travel distance. Even if the electronic device 5100 has a variety of functions, it is not often that all the functions are used at a time, and only one or two functions are usually used as necessary. In the case where the electronic device 5100 including a plurality of power storage elements, each of which is prepared for a different function, has a variety of functions, only the function to be used is turned on and electric power is supplied thereto from a power storage element corresponding to that function; whereby, power consumption can be reduced. Furthermore, power storage elements corresponding to the functions not in use, among the plurality of power storage elements, can be wirelessly charged from an antenna provided in the car.

FIG. 17B illustrates an example in which an information terminal is operated in an airplane or the like. Since a period in which an individual can use his/her own information terminal is limited in an airplane or the like, the airplane is desired to be equipped with information terminals that the passengers can use when the flight is long.

An electronic device 5200, having a display portion 5202 that displays images such as a movie, a game, and a commercial, is an information terminal with which the current flying location and the remaining flight time can be obtained in real time, owing to its communication function. The display portion 5202 has a touch input function.

The electronic device 5200 can be fit into a depressed portion in a seat 5201, and an antenna installation portion 5203 is provided in a position that overlaps with the electronic device 5200, whereby the electronic device 5200 can be wirelessly charged while it is fit into the depressed portion. Furthermore, the electronic device 5200 can function as a telephone or communication tool when the user is sick and wants to contact a flight attendant, for example. If the electronic device 5200 has a translation function, the user can communicate with a flight attendant by using the display portion 5202 of the electronic device 5200 even when the user and the flight attendant speak different languages. Furthermore, passengers seated next to one another who speak different languages can communicate by using the display portion 5202 of the electronic device 5200. In addition, the electronic device 5200 can function as a message board, displaying a message in English such as "please do not disturb" on the display portion 5202 while the user is asleep, for example.

The electronic device 5200 has a plurality of power storage elements each of which is for a different function, and only the function to be used is turned on while the other functions not in use are in an off state, whereby power consumption can be reduced. Furthermore, among the plurality of power storage elements, power storage elements corresponding to the functions not in operation can be wirelessly charged from the antenna installation portion 5203.

It is difficult to carry a dangerous object on an airplane. The electronic device 5200 having a plurality of small-sized power storage elements is highly safe, and even if one of the power storage elements explodes, the damage can be minimized because of its small size. In addition, even if one power storage element becomes unavailable because of failure, explosion, or breakage, some of the functions of the electronic device 5200 can still be used by utilizing the other power storage elements.

The plurality of power storage elements of the electronic device 5200 provided over the plurality of seats may be designed such that they can be used in emergency when an airplane has an electrical problem. Since all the electronic devices 5200, each of which is provided for each of the plurality of seats, are the same products having the same design, a system may be constructed such that the electronic devices 5200 can be connected in series as an emergency power supply.

As the plurality of small-sized power storage elements of the electronic device 5200, one or more kinds selected from the following can be used: a lithium ion secondary battery such as a lithium polymer battery, a lithium ion capacitor, an electric double-layer capacitor, and a redox capacitor.

The structure described in this embodiment can be used in appropriate combination with the structure described in any of the other embodiments.

Embodiment 5

In this embodiment, an example of an artificial organ that is one embodiment of the present invention will be described.

Figure 18:
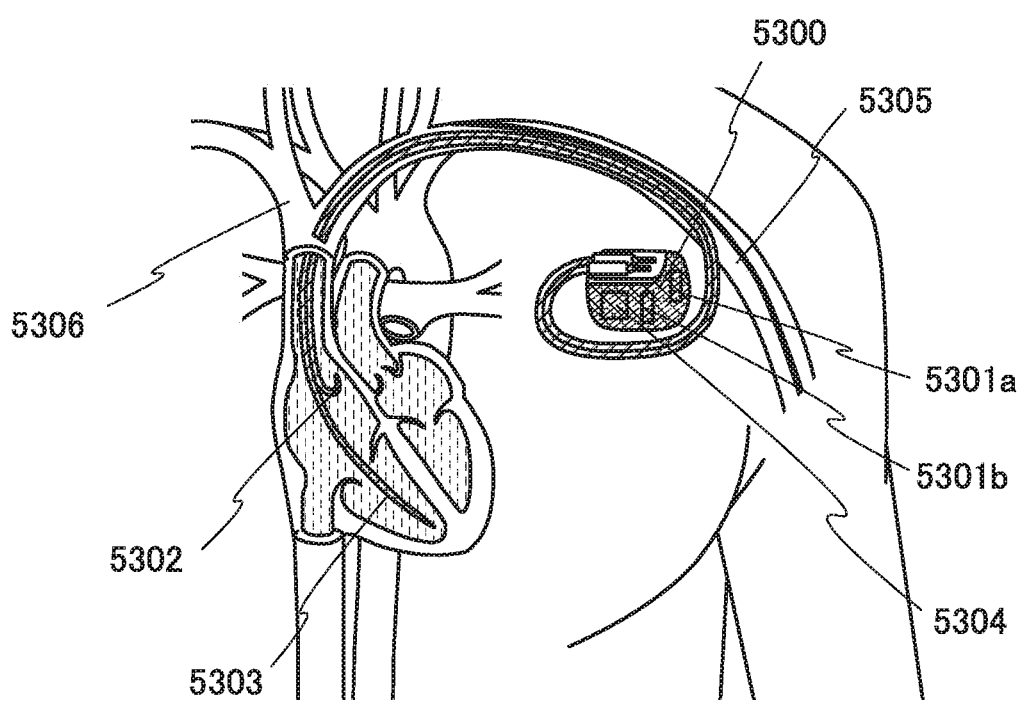
FIG. 18 illustrates an example of an electronic device.

FIG. 18 is a cross-sectional schematic view of an example of a pacemaker.

A pacemaker body 5300 includes at least power storage elements 5301a and 5301b, a regulator, a control circuit, an antenna 5304, a wire 5302 reaching a right atrium, and a wire 5303 reaching a right ventricle.

The pacemaker body 5300 is implanted in the body by surgery, and the two wires pass through a subclavian vein 5305 of the human body, with the end of one of them placed in the right ventricle and the end of the other of them placed in the right atrium.

The antenna 5304 can receive electric power, and the plurality of power storage elements 5301a and 5301b are charged with the electric power, which can reduce the frequency of replacing the pacemaker. Since the pacemaker body 5300 has a plurality of power storage elements, the safety is high, and even when one of the power storage elements fails, the other can function. In this manner, the plurality of power storage elements function as auxiliary power supplies. Furthermore, if the power storage element to be provided in the pacemaker is further divided into a plurality of thin power storage elements to be mounted on a printed board where control circuits including a CPU and the like are provided, the pacemaker body 5300 can be smaller in size and thickness.

In addition to the antenna 5304 that can receive electric power, an antenna that can transmit a physiological signal may be provided for the pacemaker. For example, a system that monitors the cardiac activity, capable of monitoring physiological signals such as pulses, respiratory rate, heart rate, and body temperature with an external monitoring device may be constructed.

If the pacemaker can be small in size and thickness according to this embodiment, a protrusion generated in the portion where the pacemaker body 5300 is implanted can be unnoticeably small.

Note that how the pacemaker is placed here is just an example, and it can be changed in various ways depending on the heart disease.

Furthermore, this embodiment is not limited to the pacemaker. An artificial ear is an artificial organ that is more widely used than the pacemaker. An artificial ear converts a sound into an electric signal and directly stimulates the auditory nerve with a stimulus device in the cochlea.

An artificial car includes a first device implanted deep in the ear by surgery and a second device that picks up sounds with a microphone and sends them to the implanted first device. The first device and the second device are not electrically connected to each other, and transmission and reception between the two are conducted wirelessly. The first device includes at least an antenna that receives an electric signal converted from a sound and a wire that reaches the cochlea. The second device includes at least a sound processing portion for converting a sound into an electric signal and a transmitting circuit that transmits the electric signal to the first device.

In this embodiment, a small-sized power storage element is provided in each of the first device and the second device, whereby the artificial ear can be reduced in size.

Since artificial cars are often implanted by surgery in childhood, reduction in size is desired.

If reduction in size of an artificial car is achieved by this embodiment, a protrusion generated in the portion where the artificial car is implanted can be unnoticeably small.

The structure described in this embodiment can be used in appropriate combination with the structure described in any of the other embodiments.

Embodiment 6

In this embodiment, an example of a wearable electronic device that is one embodiment of the present invention will be described.

Figure 19A:
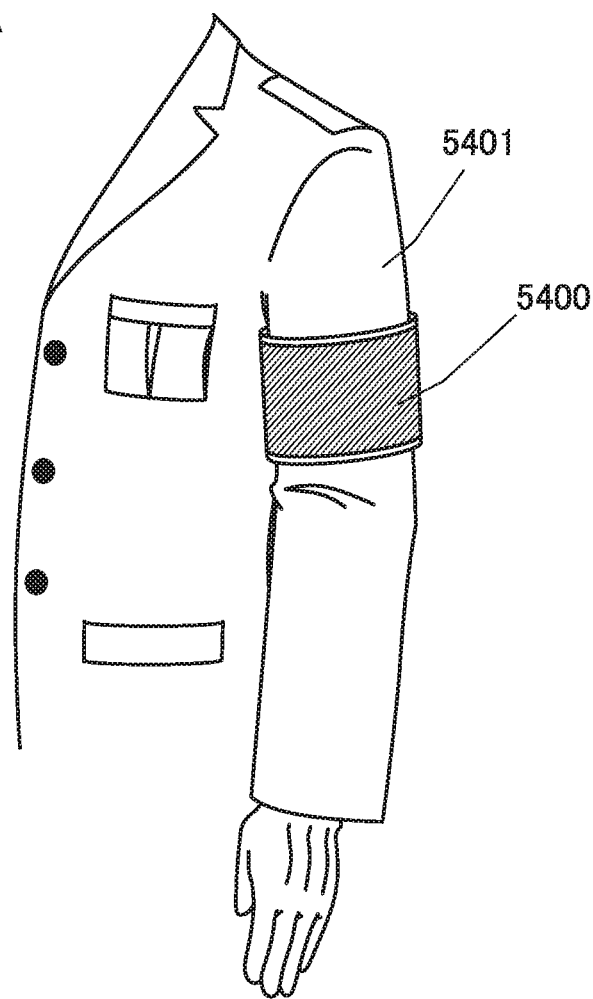
FIGS. 19A and 19B each illustrate an example of an electronic device.

In the case where an electronic device with a complex shape is manufactured, a plurality of small-sized power storage elements are placed in predetermined places as appropriate, whereby the degree of freedom in design of the electronic device can be increased. As shown in FIG. 19A, an electronic device 5400 has a cylindrical form. In order for the electronic device 5400 to be worn on the human body, a plurality of power storage elements rather than a single power storage element are appropriately placed, whereby a feeling of the weight can be reduced. Furthermore, if the device has a number of functions, consumption of a power storage element in a standby state increases; therefore, power storage elements for the respective functions are prepared. In the case where the electronic device 5400 having a plurality of power storage elements has a variety of functions, only the function to be used is turned on and electric power is supplied from the power storage element corresponding to the function, whereby power consumption can be reduced.

The electronic device 5400 is worn on the left upper arm, over a clothes 5401, as shown in FIG. 19A. Examples of the clothes 5401 include clothes with sleeves, such as a military uniform, an assault jacket, a suit jacket, a uniform, and space suits. There is no particular limitation on how to put on the electronic device 5400, and examples of ways to put it on include sewing it on a portion of clothes that overlaps with the upper arm, attaching it with a Velcro fastener (registered trademark) or the like provided on a portion of clothes that overlaps with the upper arm, fixing it with a band, a clasp, or the like, and binding a band-like leaf spring around an upper arm.

Figure 19B:
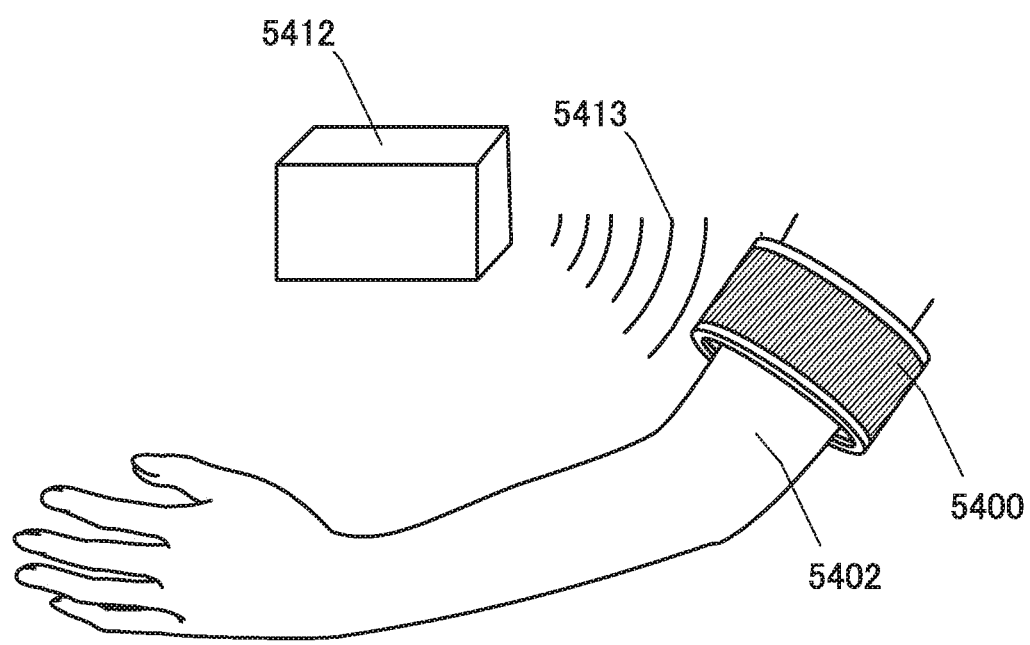

The electronic device 5400 has an antenna. A perspective view in which the electronic device 5400 is worn on the skin and wirelessly charged is shown in FIG. 19B. In FIG. 19B, the electronic device 5400 is worn on an upper arm 5402. A surface of the electronic device 5400 that is to be in contact with the skin is preferably formed using a skin-friendly film or a natural material such as leather, paper, and fabric. The numeral 5412 indicates an electric power transmission device that can wirelessly charge the electronic device 5400 with the use of a radio wave 5413. When provided with an antenna or a circuit that can transmit and receive other data, the electronic device 5400 can transmit and receive other data as well as power. For example, the electronic device 5400 can also be used like a smartphone.

The structure described in this embodiment can be used in appropriate combination with the structure described in any of the other embodiments.

Embodiment 7

In this embodiment, examples of electronic devices for which one embodiment of the present invention can be used will be described with reference to FIGS. 20A to 20C.

Figure 20A:
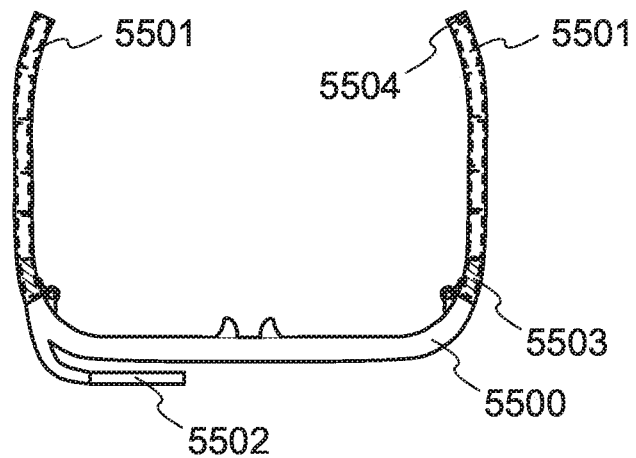
FIGS. 20A and 20C are top views and FIG. 20B is a perspective view showing examples of an electronic device.
Figure 20B:
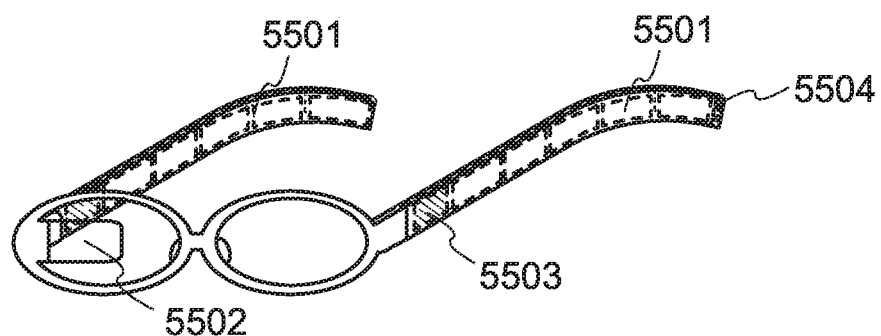

FIG. 20A is a top view of a glasses-type device 5500, and FIG. 20B is a perspective view thereof.

The glasses-type device 5500 includes a portion that is positioned along each side of the head of the user when the device is worn (hereinafter referred to as temples), and a plurality of power storage elements 5501 are provided in each of the right and left temples.

In addition, the glasses-type device 5500 may include a terminal portion 5504. The power storage elements 5501 can be charged through the terminal portion 5504. Furthermore, the power storage elements 5501 are preferably electrically connected to each other. When the power storage elements 5501 are electrically connected to each other, all the power storage elements 5501 can be charged through the one terminal portion 5504.

The glasses-type device 5500 may further include a display portion 5502. In addition, the glasses-type device 5500 may include a control portion 5503. The control portion 5503 can control charge and discharge of the power storage elements 5501 and can generate image data to be displayed on the display portion 5502. Moreover, if a chip having a wireless communication function is included in the control portion 5503, data can be transmitted to and received from the outside.

Figure 20C:
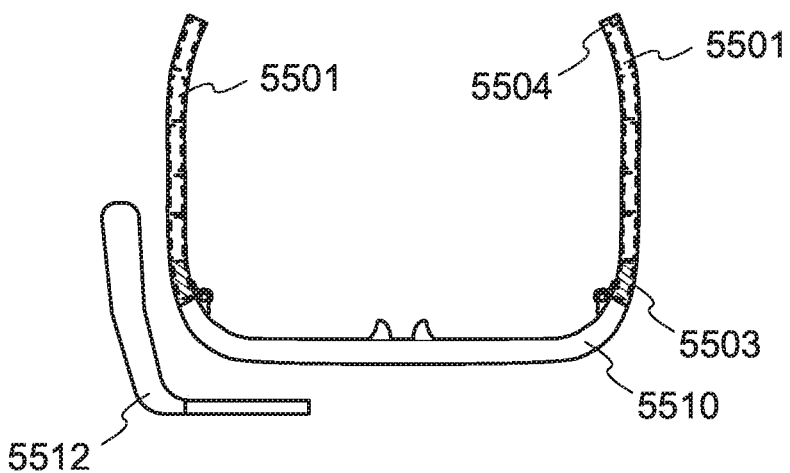

Alternatively, as illustrated in FIG. 20C, a glasses-type device 5510 that is not provided with the display portion 5502 may be provided. An external display portion 5512 may be attached to the glasses-type device 5510. Thus, the distance between the eyes of the user and the display portion 5512 can be easily adjusted.

Furthermore, between the glasses-type device 5510 and the external display portion 5512, wireless communication and wireless power feeding may be performed.

The structure described in this embodiment can be used in appropriate combination with the structure described in any of the other embodiments.

Embodiment 8

In this embodiment, an example of a semiconductor device that can be used for the device 10 described in Embodiment 1 will be described with reference to FIG. 21 and FIGS. 22A and 22B.

Figure 21:
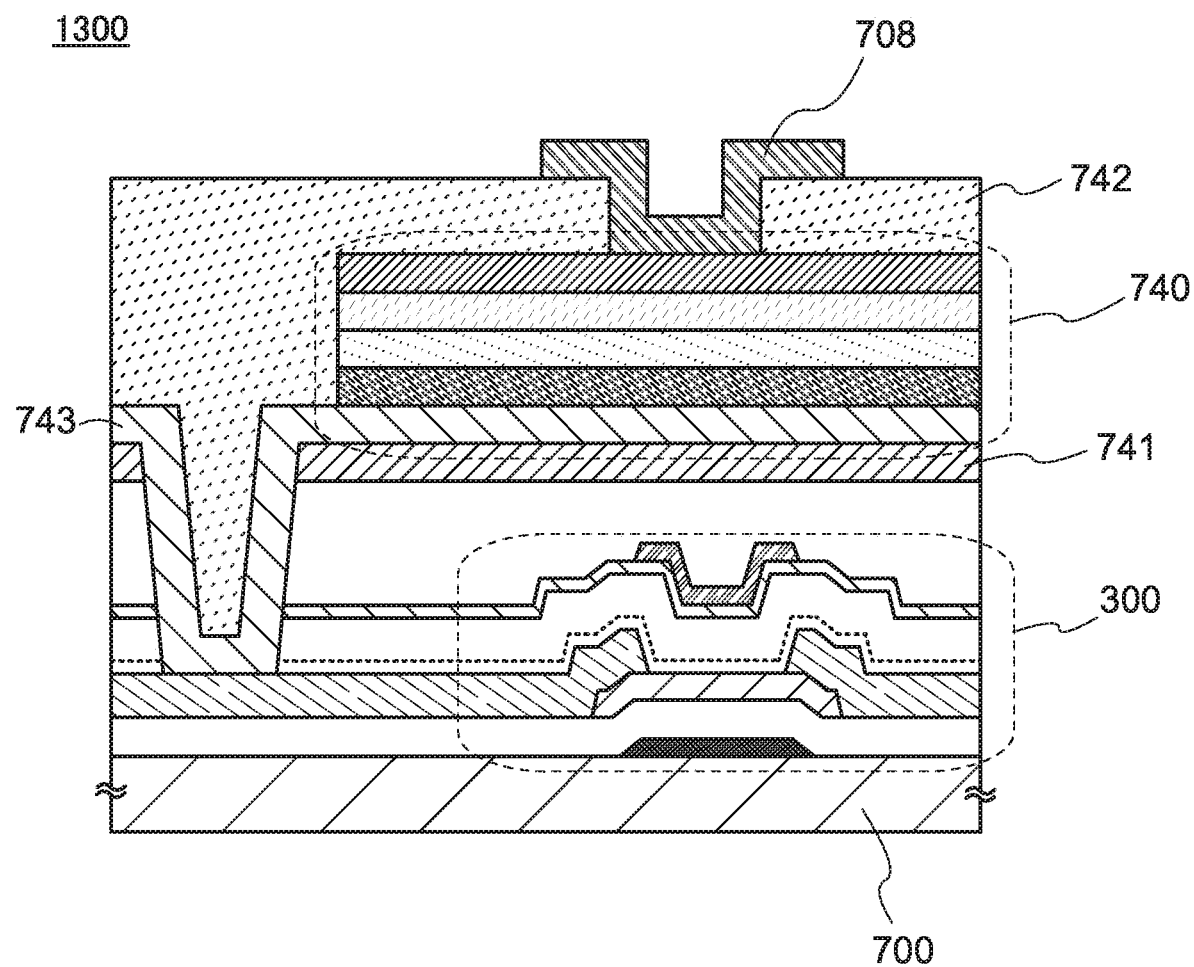
FIG. 21 is a cross-sectional view showing a structural example of a semiconductor device.

FIG. 21 is a cross-sectional view of a semiconductor device 1300 that can be used for the device 10.

The semiconductor device 1300 includes a substrate 700, a transistor 300, a power storage element 740, an insulating film 741, an insulating film 742, a wiring 743, and a wiring 708.

In the semiconductor device 1300, the transistor 300 and the power storage element 740 are provided over the same substrate.

For the details of the substrate 700, the power storage element 740, the insulating films 741 and 742, and the wiring 708, the description of the semiconductor device 1000 in shown in FIG. 2 is referred to.

The wiring 743 may have a function of a current collector of the power storage element 740, in addition to a function of a wiring. For the detail of the wiring 743, the description of the current collector layer 202 shown in FIGS. 5A to 5C is referred to.

Note that the regions without any reference numeral or hatching pattern are regions made up of insulators in FIG. 21. The regions can be each formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, in these regions, an organic resin such as a polyimide resin, a polyamide resin, an acrylic resin, a siloxane resin, an epoxy resin, or a phenol resin can be used.

Next, the detail of the transistor 300 will be described with reference to FIGS. 22A and 22B.

Figure 22A:
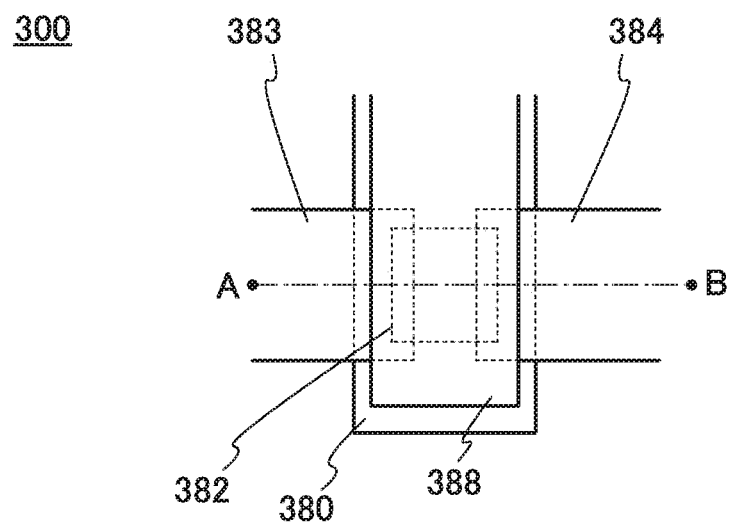
FIG. 22A is a top view and FIG. 22B is a cross-sectional view showing a structural example of a transistor.
Figure 22B:
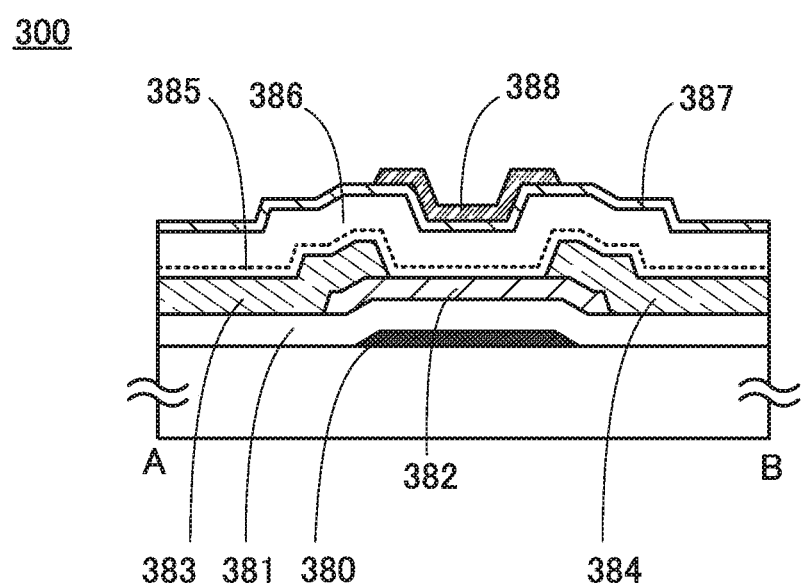

FIGS. 22A and 22B are a top view and a cross-sectional view of the transistor 300. FIG. 22A is the top view, and FIG. 22B corresponds to the cross section in the dashed-dotted line A-B direction in FIG. 22A. In FIGS. 22A and 22B, some components are increased or reduced in size, or omitted for easy understanding. The dashed-dotted line A-B direction may be referred to as a channel length direction.

The transistor 300 in FIG. 22B includes a conductive film 380 functioning as a first gate, a conductive film 388 functioning as a second gate, a semiconductor 382, conductive films 383 and 384 functioning as a source and a drain, an insulating film 381, an insulating film 385, an insulating film 386, and an insulating film 387.

The conductive film 380 is provided over an insulating surface. The conductive film 380 and the semiconductor 382 overlap with each other with the insulating film 381 positioned therebetween. The conductive film 388 and the semiconductor 382 overlap with each other with the insulating films 385, 386, and 387 positioned therebetween. The conductive films 383 and 384 are connected to the semiconductor 382.

For the details of the conductive films 380 and 388, the descriptions of the conductive films 673 and 674 shown in FIGS. 11A to 11D are referred to.

The conductive films 380 and 388 may be supplied with different potentials, or may be supplied with the same potential at the same time. The provision of the conductive film 388 functioning as the second gate electrode in the transistor 300 makes it possible to stabilize the threshold voltage. The conductive film 388 may be omitted in some cases.

For the detail of the semiconductor 382, the description of the semiconductor 662 shown in FIGS. 11B to 11D is referred to. The semiconductor 382 may be a single layer or a stack of a plurality of semiconductor layers.

For the details of the conductive films 383 and 384, the descriptions of conductive films 671 and 672 shown in FIGS. 11A, 11B and 11D are referred to.

For the detail of the insulating film 381, the description of the insulating film 653 shown in FIGS. 11B to 11D is referred to.

Note that in FIG. 22B, the insulating films 385 to 387 are sequentially stacked over the semiconductor 382 and the conductive films 383 and 384; however, the number of insulating films provided over the semiconductor 382 and the conductive films 383 and 384 may be one or a plurality of insulating films may be stacked.

In the case where an oxide semiconductor is used for the semiconductor 382, the insulating film 386 preferably contains oxygen at a proportion higher than or equal to the stoichiometric composition and has a function of supplying part of oxygen to the semiconductor 382 by heating. However, in the case where the provision of the insulating film 386 directly on the semiconductor 382 causes damage to the semiconductor 382 at the time of forming the insulating film 386, the insulating film 385 is preferably provided between the semiconductor 382 and the insulating film 386 as shown in FIG. 22B. The insulating film 385 preferably causes little damage to the semiconductor 382 when the insulating film 385 is formed compared to the case of the insulating film 386 and has a function of passing oxygen. If the insulating film 386 can be formed directly on the semiconductor 382 while suppressing damage to the semiconductor 382, the insulating film 385 need not necessarily be provided.

For the insulating films 385 and 386, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 387 preferably has an effect of blocking diffusion of oxygen, hydrogen, and water. Alternatively, the insulating film 387 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film, that has an effect of blocking diffusion of hydrogen and water can be formed using, for example, silicon nitride or silicon nitride oxide.

In the case where the insulating film 387 has an effect of blocking diffusion of water, hydrogen, and the like, impurities such as water and hydrogen that exist in a resin in a panel or exist outside the panel can be prevented from entering the semiconductor 382. In the case where an oxide semiconductor is used for the semiconductor 382, part of water or hydrogen entering the oxide semiconductor serves as an electron donor (donor). Thus, the use of the insulating film 387 having the blocking effect can prevent a shift in threshold voltage of the transistor 300 due to generation of donors.

In addition, in the case where an oxide semiconductor is used for the semiconductor 382, when the insulating film 387 has an effect of blocking diffusion of oxygen, diffusion of oxygen from the oxide semiconductor to the outside can be prevented. Accordingly, oxygen vacancies in the oxide semiconductor that serve as donors are reduced, so that a shift in threshold voltage of the transistor 300 due to generation of donors can be prevented.

Note that the transistor 300 may be used as the transistor 730 described in Embodiment 1.

The semiconductor device 1300 can be used for the device 10. For example, fabricating the display portion 16 or the display driver circuit 19 in the device 10 in FIG. 1 with the use of the transistor 300 and fabricating the power storage element 17 with the use of the power storage element 740 can reduce the device 10 in size or thickness.

The structure described in this embodiment can be used in appropriate combination with the structure described in any of the other embodiments.

This application is based on Japanese Patent Application serial no. 2014-162455 filed with Japan Patent Office on Aug. 8, 2014, the entire contents of which are hereby incorporated by reference.

What is claimed is:

1. A semiconductor device comprising:
 a first circuit comprising a first transistor;
 a first insulating film over the first transistor;
 a capacitor over the first insulating film;
 a second insulating film over the capacitor; and
 a second circuit comprising a second transistor over the second insulating film,
 wherein the second transistor comprises a semiconductor film comprising a channel formation region,
 wherein the semiconductor film comprises a first opening and a second opening,
 wherein a first connection electrode penetrates the semiconductor film through the first opening, and
 wherein a second connection electrode penetrates the semiconductor film through the second opening.

2. The semiconductor device according to claim 1, further comprising a circuit comprising the capacitor,
 wherein the second transistor comprises a gate electrode below the channel formation region.

3. The semiconductor device according to claim 2, wherein the first connection electrode electrically connects the first circuit and the second circuit.

4. The semiconductor device according to claim 3, wherein the second connection electrode electrically connects the circuit comprising the capacitor and the second circuit.

5. The semiconductor device according to claim 2, wherein the second connection electrode electrically connects the circuit comprising the capacitor and the second circuit.

* * * * *